United States Patent
Kozasa et al.

(10) Patent No.: US 7,303,691 B2
(45) Date of Patent: Dec. 4, 2007

(54) POLISHING METHOD FOR SEMICONDUCTOR WAFER

(75) Inventors: Kazuaki Kozasa, Hiratsuka (JP);
Motoharu Yamada, Hiratsuka (JP);
Yasuhiro Tomita, Hiratsuka (JP);
Hiromi Wakabayashi, Hiratsuka (JP)

(73) Assignee: Sumco Techxiv Corporation, Hiratsuka-shi (JP)

( * ) Notice: Subject to any disclaimer, the term of this patent is extended or adjusted under 35 U.S.C. 154(b) by 58 days.

(21) Appl. No.: 11/512,837

(22) Filed: Aug. 30, 2006

(65) Prior Publication Data

US 2007/0059935 A1    Mar. 15, 2007

(30) Foreign Application Priority Data

Sep. 6, 2005  (JP) ............ 2005-258134
Sep. 6, 2005  (JP) ............ 2005-258150

(51) Int. Cl.
*B44C 1/22* (2006.01)
*H01L 21/461* (2006.01)

(52) U.S. Cl. ............ 216/89; 216/93; 438/692; 438/693; 451/34

(58) Field of Classification Search ............ 216/89, 216/93; 438/692, 693; 451/34
See application file for complete search history.

(56) References Cited

U.S. PATENT DOCUMENTS 6,488,570 B1 * 12/2002 James et al. ............ 451/36
6,811,467 B1 * 11/2004 Beresford et al. ............ 451/28
2001/0036798 A1 * 11/2001 Oliver ............ 451/41
2004/0144755 A1 *  7/2004 Motonari et al. ............ 216/88
2004/0209554 A1 * 10/2004 Tsumagari et al. ............ 451/36
2005/0176606 A1 *  8/2005 Konno et al. ............ 510/175
2005/0205836 A1 *  9/2005 Yoshizawa et al. ............ 252/79.1
2006/0032148 A1 *  2/2006 Kunugi et al. ............ 51/307

FOREIGN PATENT DOCUMENTS

| JP | 2000-063806 A | 2/2000 |
| JP | 2000-237959 A | 5/2000 |
| JP | 2002-154056 A | 5/2002 |
| JP | 2002-170793 A | 6/2002 |
| JP | 2003-309091 A | 10/2003 |
| JP | 2003-531023 A | 10/2003 |
| JP | 2005-045102 A | 2/2005 |

* cited by examiner

*Primary Examiner*—Binh X. Tran
(74) *Attorney, Agent, or Firm*—Frishauf, Holtz, Goodman & Chick, P.C.

(57) ABSTRACT

A polishing method includes a slurry adjusting step for adjusting a polishing slurry containing silica particles so that the number of silica particles having a composition ratio of Si/O of 50–60 wt %/40–50 wt %, a modulus of elasticity of $1.4 \times 10^{10}$ Pa or higher and a particle size of 1 μm or larger is 3000 pcs/ml or less. A semiconductor wafer is polished using the polishing slurry adjusted in the slurry adjusting step.

12 Claims, 17 Drawing Sheets

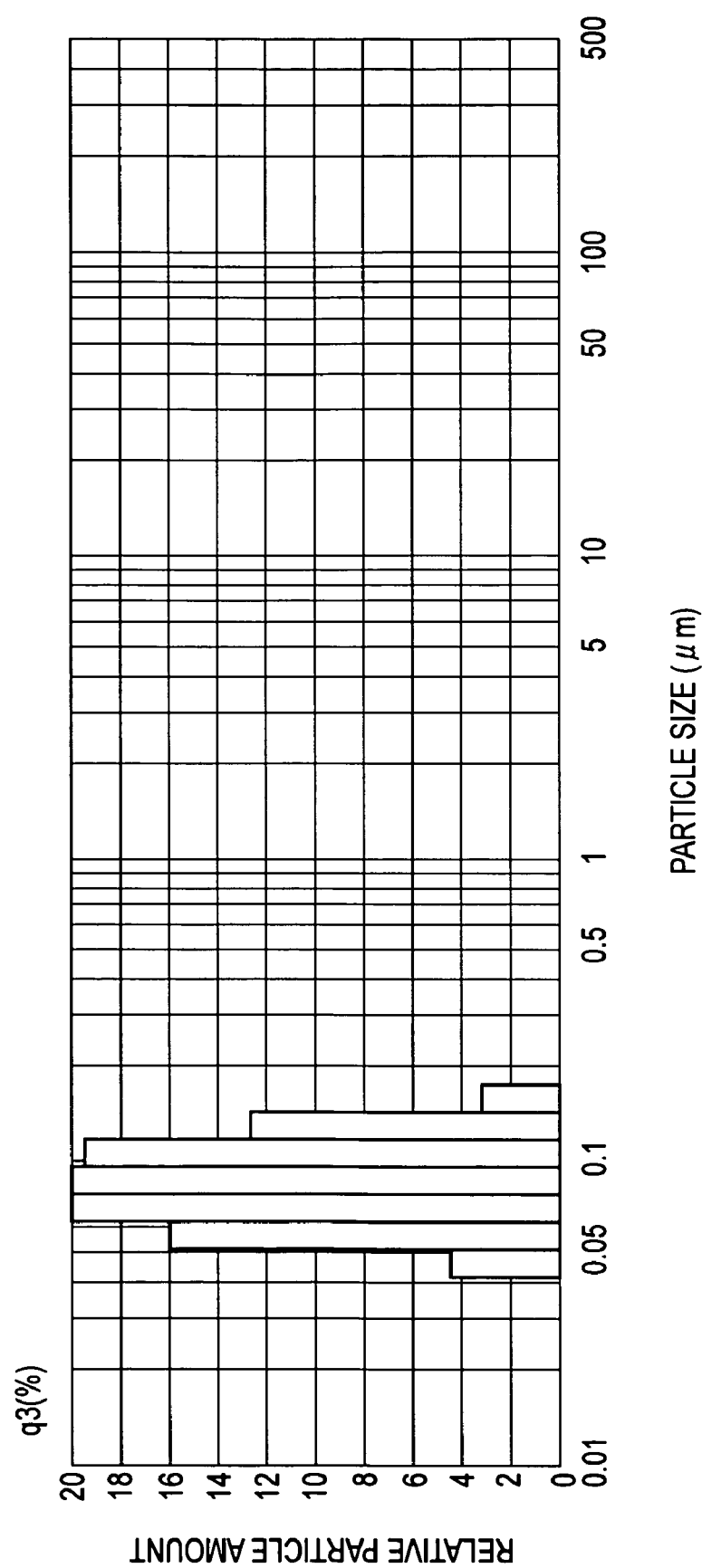

POLISHING METHOD FOR SEMICONDUCTOR WAFER

BACKGROUND OF THE INVENTION

1. Field of the Invention

The present invention relates to a polishing method for a semiconductor wafer for polishing the semiconductor wafer.

2. Description of Related Art

As a method for polishing a semiconductor wafer using a polishing slurry, there has been conventionally employed a method including a primary polishing step, a secondary polishing step and a finish polishing step. In such polishing method, the polishing slurry is reused in the primary polishing step and the secondary polishing step in terms of production cost.

As an arrangement applicable to such rough polishing steps prior to the finish polishing, there has been known a polishing system for polishing the semiconductor wafer using a recycled polishing slurry (see, for instance, Document: JP-A-2000-237959, left column of page 4 to right column of page 5).

In a system disclosed in the Document, new slurry is fed from an unused slurry feeding unit to a buffer tank, while a recycled slurry after filtering is fed from a recycle unit to the buffer tank. Then, the polishing slurries stored in the buffer tank are fed to each of polishing sections by pumps connected to each of the polishing sections, the pumps being separately controllable.

On the other hand, in the finish polishing, the polishing slurry recycled using the system disclosed in the Document is not typically used. Instead, a finishing-slurry prepared solution is used, the finishing-slurry prepared solution being prepared by adding alkaline solution and water-soluble polymer agent to silica particle to obtain a finishing-slurry stock solution and further adding purified water to the finishing-slurry stock solution.

However, when the system disclosed in the Document is applied to the rough polishing step, contaminants that are contained in the recycled polishing slurry and cannot be removed by filtering might cause a lot of minute projecting defects to be generated on the semiconductor wafer.

In addition, when the finishing-slurry prepared solution as described above is used in the finish polishing step, contaminants contained in the finishing-slurry prepared solution might cause a lot of projecting defects to be generated on the semiconductor wafer.

SUMMARY OF THE INVENTION

An object of the present invention is to provide a polishing method for a semiconductor wafer which provides proper polishing of the semiconductor wafer.

In a keen study, the inventor of the present invention found out that a stock solution of a polishing slurry (hereinafter, referred to as a polishing-slurry stock solution) contains primary particles of silica having a particle size distribution as shown in FIG. 19 in which the largest particle size is 0.1 μm.

Also, the inventor found out that a polishing slurry to be reused (hereinafter, referred to as a recycled slurry) contains: aggregates of silica particle in which the primary particles of the silica are aggregated due to a high pressure applied during polishing (hereinafter, referred to as an aggregated silica particle); and crystal substances of the silica particle that are formed when the polishing slurry is dried (hereinafter, referred to as a dried silica particle), the silica particles having a particle size distribution as shown in FIG. 20. It was verified that the aggregated silica particle and the dried silica particle are different from each other in composition ratio of Si/O and modulus of elasticity. To be specific, the aggregated silica particle has the composition ratio of Si/O of 40–50 wt %/50–60 wt % and the modulus of elasticity of lower than $1.4 \times 10^{10}$ Pa. The dried silica particle has the composition ratio of Si/O of 50–60 wt %/40–50 wt % and the modulus of elasticity of $1.4 \times 10^{10}$ Pa or higher.

In addition, it was verified that the aggregated silica particle had lower hardness and had weaker correlation with the number of projecting defect having heights of 10 nm or less resulted from the polishing (hereinafter, referred to as a minute defect) as compared to the dried silica particle, as shown in FIGS. 21 and 22.

When the recycled slurry to be used in the rough polishing step just before the finish polishing step is filtered, there might be the following problems. When the size of solid matters that can be captured by filtering is small, a lot of aggregated silica particles and dried silica particles are removed, which lowers polishing rate. On the other hand, when the size of solid matters that can be captured by filtering is large, large dried silica particles cannot be removed, which increases the minute defects.

A finish-slurry stock solution that is obtained by adding alkaline solution and water-soluble polymer agent to the silica particles was verified to contain silica particles having particle sizes of approx. 0.05 to 100 μm as shown in a graph of FIG. 23. It was verified that the reason for such wide range of particle sizes was that the silica particles were aggregated due to the water-soluble polymer agent contained in the finishing-slurry stock solution.

In addition, the finishing-slurry stock solution was verified to contain crystal substances if the silica which are formed when the finishing-slurry stock solution was dried (hereinafter, referred to as a dried silica particle). The dried silica particle has the composition ratio of Si/O of 50–60 wt %/40–50 wt % and the modulus of elasticity of $1.4 \times 10^{10}$ or higher.

Thus, an effective way for reducing the minute defects caused by the dried silica particle is to remove the dried silica particles from the finishing-slurry stock solution.

However, when the finishing-slurry stock solution is filtered by a filter to remove the dried silica particles, the filter is easily clogged with silica particles with large particle sizes produced by aggregation due to the effect of the water-soluble polymer agent, so that silica particles other than the dried silica particles are also removed. Accordingly, a specific gravity of the finishing-slurry stock solution is lowered, thereby significantly degrading polishing performances.

It was verified that when, for instance, an ultrasonic wave was applied to the finishing-slurry stock solution having a particle size distribution as shown in FIG. 23 in order to disperse the silica particle aggregated due to the effect of the water-soluble polymer agent, the finishing-slurry stock solution turned to contain silica particles having particle sizes of approx. 0.05 to 0.2 μm as shown in a graph of FIG. 24.

The present invention has been devised on the basis of knowledge as described above.

According to an aspect of the present invention, a polishing method for a semiconductor wafer includes: a slurry adjusting step for adjusting a polishing slurry containing silica particles so that the number of silica particles having a composition ratio of Si/O of 50–60 wt %/40–50 wt %, a modulus of elasticity of $1.4 \times 10^{10}$ Pa or higher and a particle size of 1 μm or larger is 3000 pcs/ml or less. The semiconductor wafer is polished using the polishing slurry adjusted in the slurry adjusting step.

According to the aspect of the present invention, in the slurry adjusting step, the polishing slurry containing the silica particle is so adjusted that the number of silica particles having the composition ratio of Si/O of 50–60 wt %/40–50 wt %, the modulus of elasticity of $1.4 \times 10^{10}$ Pa or higher and the particle size of 1 μm or larger is 3000 pcs/ml or less, namely the polishing slurry is so arranged that the number of dried silica particles having the particle size of 1 μm or larger is 3000 pcs/ml or less. The semiconductor wafer is polished using the polishing slurry adjusted in the slurry-adjusting step.

With the arrangement, the content of the dried silica particles in the polishing slurry to be used in the rough polishing step just before the finish polishing step, i.e., a content of components harder than the aggregated silica particles, is adjusted. Accordingly, as compared to an arrangement in which contents of the aggregated silica particles and the dried silica particles are adjusted, polishing rate can be enhanced, while reducing the number of minute defects generated in the rough polishing step.

The lower limit of the particle size of which the content is adjusted is set to 1 μm, which is the maximum value of a machining allowance in a typical finish polishing step. Accordingly, as compared to an arrangement in which the lower limit is set to be higher than 1 μm, heights of the minute defects generated in the rough polishing step can be easily adjusted to 1 μm or less, thereby realizing effective finish polishing.

In addition, since the upper limit of the content to be adjusted is set to 3000 pcs/ml, the number of minute defects generated in the rough polishing step can be controlled to a predetermined number or less as shown in FIG. 21.

Therefore, the semiconductor wafer can be polished properly.

According to the aspect of the present invention, it is preferable that polishing of the semiconductor wafer includes two steps of a rough polishing step and a finish polishing step. The polishing slurry adjusted in the slurry adjusting step was used in the rough polishing step.

According to the aspect of the present invention, it is preferable that the slurry adjusting step includes: a stock-solution filtering step for filtering a stock solution of the polishing slurry with a first filter adapted to capture a solid matter having a predetermined size; a slurry producing step for producing the polishing slurry by compounding the stock solution of the polishing slurry filtered in the stock-solution filtering step and an additive; and a prepared-solution filtering step for filtering the polishing slurry produced in the slurry producing step with a second filter adapted to capture a solid matter having a size smaller than that captured by the first filter.

According to the aspect of the present invention, the slurry adjusting step includes: the stock-solution filtering step for filtering a stock solution of the polishing slurry (hereinafter, referred to as a polishing-slurry stock solution) with the first filter adapted to capture the solid matters of a predetermined size; the slurry producing step for adding the additive to the polishing-slurry stock solution filtered in the stock-solution filtering step to produce the polishing slurry; and the prepared-solution filtering step for filtering the polishing slurry with the second filter adapted to capture the solid matters of the size smaller than those captured by the first filter. Accordingly, by simply providing the first filter and the second filter in the slurry adjusting step, the polishing slurry can be adjusted as described above so that the polishing slurry can polish the semiconductor wafer properly.

Even when the dried silica particles are generated while the rough-polishing-slurry stock solution is stored, the dried silica particles having a predetermined size or larger are removed in the stock-solution filtering step, the number of dried silica particles contained in the polishing slurry produced in the slurry producing step can be reduced. In addition, the size of irremovable dried silica particles can be minimized. Thus, as compared to an arrangement without the stock-solution filtering step, the number of dried silica particles to be captured in the prepared-solution filtering step can be reduced, so that clogging of the second filter in the prepared-solution filtering step can be reduced, thereby effectively adjusting the polishing slurry.

According to the aspect of the present invention, it is preferable that a capturing efficiency of the first filter for capturing a solid matter having a size equal to or more than fifty times as large as a primary particle of silica contained in the stock solution of the polishing slurry is 99.99% or higher, and a capturing efficiency of the second filter for capturing a solid matter having a size equal to or more than ten times as large as the primary particle is 99.99% or higher.

According to the aspect of the present invention, the first filter has the capturing efficiency of 99.99% for capturing the solid matters having the size equal to or more than fifty times as large as the primary particles of the silica, and the second filter has the capturing efficiency of 99.99% for capturing the solid matters having the size equal to or more than ten times as large as the primary particles of the silica particles, thereby adjusting the polishing slurry more effectively as compared to an arrangement having other capturing performances.

According to the aspect of the present invention, it is preferable that the slurry adjusting step further includes a centrifugalizing step for centrifugalizing the polishing slurry.

According to the aspect of the present invention, since the slurry adjusting step includes the centrifugalizing step for centrifugalizing the polishing slurry, by centrifugalizing the aggregated silica particles and the dried silica particles utilizing difference in density, the polishing slurry can be adjusted so that the polishing slurry can properly polish the semiconductor wafer as described above. In addition, since the used polishing slurry can be reused in the rough polishing step just before the finish polishing step, usage amount of the polishing-slurry stock solution can be reduced.

According to the aspect of the present invention, it is preferable that a centrifugal force for the centrifugalizing in the centrifugalizing step is in the range from 5000 G to 10000 G.

According to the aspect of the present invention, since the lower limit of the centrifugal force in the centrifugalizing step is set to 5000 G, the dried silica particles can be centrifugalized and removed, thus reducing the number of minute defects. On the other hand, since the upper limit of the centrifugal force is set to 10000 G, the number of aggregated silica particles to be centrifugalized and removed can be minimized, thereby realizing polishing without lowering the polishing rate.

According to the aspect of the present invention, it is preferable that the slurry adjusting step further includes a milling step for milling the silica particles contained in the polishing slurry with a bead mill.

According to the aspect of the present invention, since the slurry adjusting step includes the milling step for milling the silica particles contained in the polishing slurry with the bead mill, the dried silica particles contained in the polishing slurry can be milled, so that the polishing slurry can be adjusted so as to properly polish the semiconductor wafer as described above. Since the bead mill, of which an energy per unit mass applied to an object to be milled (hereinafter, referred to as a milling energy) is the smallest, is employed, hardness of the aggregated silica particles generated by the milling energy becomes lower as compared to an arrangement employing milling devices other than the bead mill, thereby realizing proper polishing. In addition, since the used polishing slurry can be reused in the rough polishing step just before the finish polishing step, usage amount of the polishing-slurry stock solution can be reduced.

According to the aspect of the present invention, it is preferable that an energy per unit mass applied to an object to be milled in the milling step is 20 kWh/dry kg or higher.

According to the aspect of the present invention, since the lower limit of a to-be-milled energy is set to 20 kWh/dry kg, the content of the dried silica particles in the polishing slurry can be effectively adjusted to 3000 pcs/ml or less.

According to the aspect of the present invention, it is preferable that polishing of the semiconductor wafer includes two steps of a rough polishing step and a finish polishing step. The slurry adjusting step further includes a ultrasonic irradiating stage for irradiating an ultrasonic wave to the polishing slurry and a filtering stage for filtering with a filter the polishing slurry to which the ultrasonic wave is irradiated in the ultrasonic irradiating stage, the polishing slurry being adjusted so that the number of silica particles having a composition ratio of Si/O of 50–60 wt %/40–50 wt %, a modulus of elasticity of $1.4 \times 10^{10}$ or higher and a particle size of 1 µm or larger is 1000 pcs/ml or less. The polishing slurry adjusted in the slurry adjusting step is used in the finish polishing step.

According to the aspect of the present invention, by irradiating the ultrasonic wave to the polishing slurry and filtering the ultrasonic-irradiated polishing slurry with the filter in the slurry adjusting step, the polishing slurry can be adjusted so that the number of silica particles having the composition ratio of Si/O of 50–60 wt %/40–50 wt %, the modulus of elasticity of $1.4 \times 10^{10}$ Pa or higher and the particle size of 1 µm or larger is 1000 pcs/ml or less. Then, the polishing slurry is used in the finish polishing step to polish the semiconductor wafer.

By irradiating the ultrasonic wave to the polishing slurry, the silica particles having large particle sizes, which are generated by aggregation due to the effect of the water-soluble polymer agent contained in the polymer slurry, can be dispersed. Then, by filtering with the filter the polishing slurry with the silica particles having been dispersed, clogging of the filter can be prevented, and the dried silica particle can be selectively removed. Therefore, reduction in specific gravity of the polishing slurry can be prevented, thereby preventing significant degradation of the polishing performances.

In the finish polishing step, the polishing slurry is adjusted by the ultrasonic irradiation and filtering so that the number of silica particles having the composition ratio of Si/O of 50–60 wt %/40–50 wt %, the modulus of elasticity of $1.4 \times 10^{10}$ Pa or higher and the particle size of 1 µm or larger, i.e., the dried silica particle having the particle size of 1 µm or larger, is 1000 pcs/ml or less. Accordingly, the number of minute defects generated when the adjusted polishing slurry is used in the finish polishing step can be controlled to a predetermined number or less.

Therefore, the semiconductor wafer can be polished properly.

According to the aspect of the present invention, it is preferable that, in the ultrasonic irradiating stage, the ultrasonic wave was irradiated to the polishing slurry with a temperature of the polishing slurry maintained to be 40° C. or lower.

According to the aspect of the present invention, since the ultrasonic wave is irradiated to the polishing slurry with the temperature maintained at 40° C. or lower in the ultrasonic irradiating stage, the silica particles having large particle sizes that are generated due to the effect of the water-soluble polymer agent can be dispersed under the condition where evaporation due to heat of the alkaline solution contained in the polishing slurry is prevented securely.

According to the aspect of the present invention, it is preferable that, in the filtering stage, the polishing slurry is filtered within three hours after the ultrasonic wave is irradiated to the polishing slurry in the ultrasonic irradiating stage.

According to the aspect of the present invention, since the polishing slurry is filtered within three hours after the ultrasonic wave is irradiated in the filtering stage, the dispersed silica particles can be filtered before re-aggregation due to the effect of the water-soluble polymer occurs, thereby preventing clogging of the filter more securely.

According to another aspect of the present invention, a polishing method for a semiconductor wafer for polishing the semiconductor wafer through two steps including a rough polishing step and a finish polishing step using a polishing slurry containing silica particles includes: a first slurry adjusting step for adjusting the polishing slurry so that the number of silica particles having a composition ratio of Si/O of 50–60 wt %/40–50 wt %, a modulus of elasticity of $1.4 \times 10^{10}$ Pa or higher and a particle size of 1 µm or larger is 3000 pcs/ml or less; and a second slurry-adjusting step including a ultrasonic irradiating stage for irradiating an ultrasonic wave to the polishing slurry and a filtering stage for filtering with a filter the polishing slurry to which the ultrasonic wave is irradiated in the ultrasonic irradiating stage, the polishing slurry being adjusted so that the number of silica particles having a composition ratio of Si/O of 50–60 wt %/40–50 wt % a modulus of elasticity of $1.4 \times 10^{10}$ Pa or higher and a particle size of 1 µm or larger is 1000 pcs/ml or less. In the finish polishing step, the semiconductor wafer is polished using the polishing slurry adjusted in the second slurry adjusting step.

BRIEF DESCRIPTION OF THE DRAWINGS

FIG. 24 is a graph showing a particle size distribution of silica particles contained in a related art finishing-slurry stock solution when the ultrasonic wave is irradiated thereto.

DETAILED DESCRIPTION OF PREFERRED EMBODIMENT(S)

FIRST EMBODIMENT

A first embodiment of the present invention will be described below with reference to the attached drawings.

[Arrangement of Semiconductor Wafer Polishing Device]

Figure 1:
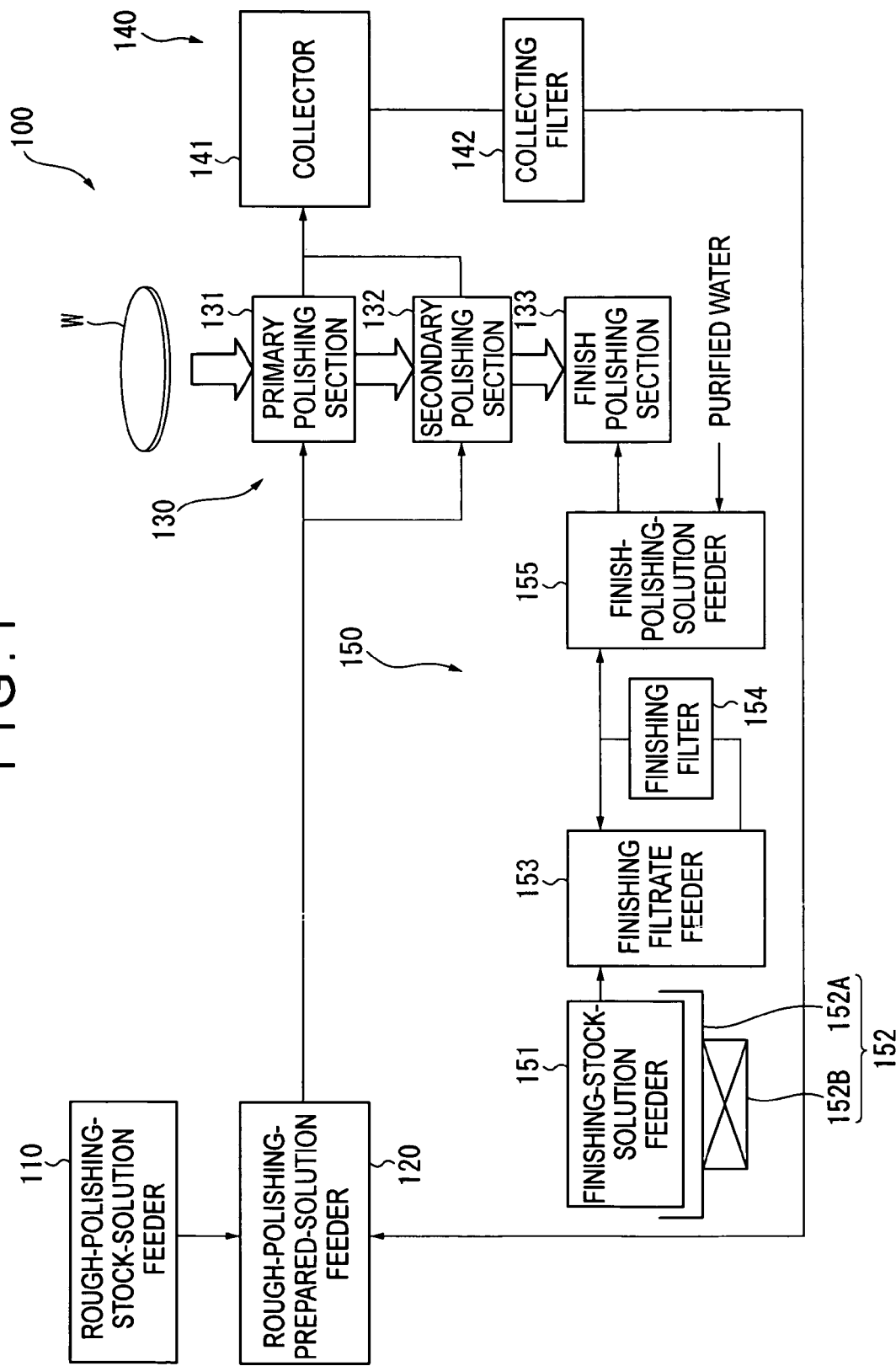
FIG. 1 is a block diagram showing an outline of a polishing device of a semiconductor wafer according to a first embodiment of the present invention.

FIG. 1 is a block diagram showing an outline of a polishing device 100 of a semiconductor wafer W of the first embodiment.

The polishing device 100 polishes a surface of the semiconductor wafer W having the diameter of 200 mm through a plurality of steps using a polishing slurry containing silica particles. Specifically, the polishing device 100 polishes the semiconductor wafer W through primary polishing, secondary polishing and finish polishing. Incidentally, the polishing device 100 may polish a semiconductor wafer W having a diameter other than 200 mm.

As shown in FIG. 1, the polishing device 100 includes a rough-polishing-stock-solution feeder 110, a rough-polishing-prepared-solution feeder 120, a polishing section 130, a collecting section 140 and a slurry adjusting section 150.

In the present embodiment, the primary polishing and the secondary polishing will be collectively referred to as rough polishing. Technologies described later in detail in second to fourth embodiments can be applied to the primary polishing and secondary polishing.

The rough-polishing-stock-solution feeder 110 is formed in, for instance, a substantially box-like shape and is connected to the rough-polishing-prepared-solution feeder 120.

A stock solution of a polishing slurry used in the rough polishing (hereinafter, referred to as a rough-polishing-slurry stock solution) is stored in the internal space of the rough-polishing-stock-solution feeder 110. The rough-polishing-stock-solution feeder 110 feeds the rough-polishing-slurry stock solution stored in the internal space thereof to the rough-polishing-prepared-solution feeder 120.

The rough-polishing-prepared-solution feeder 120 is formed in, for instance, a substantially box-like shape and is connected to a primary polishing section 131 and a secondary polishing section 132 (each described later) of the polishing section 130 and the collecting section 140.

The rough-polishing-prepared-solution feeder 120 stores the rough-polishing-slurry stock solution fed by the rough-polishing-stock-solution feeder 110. Then, the rough-polishing-prepared-solution feeder 120 adds purified water to the rough-polishing-slurry stock solution to prepare a prepared solution of a polishing slurry used in the primary polishing and the secondary polishing (hereinafter, referred to as a rough-polishing-slurry prepared solution), the rough-polishing-prepared-solution feeder 120 feeding the rough-polishing-slurry prepared solution to the primary polishing section 131 and the secondary polishing section 132.

The rough-polishing-prepared-solution feeder 120 stores a later-described rough-polishing-slurry collected filtrate that is fed by the collecting section 140 after being used in the rough polishing in the primary polishing section 131 and the secondary polishing section 132, the rough-polishing-prepared-solution feeder 120 then feeding the rough-polishing-slurry collected filtrate as the rough-polishing-slurry prepared solution to the primary polishing section 131 and the secondary polishing section 132.

The slurry adjusting section 150 performs a slurry adjusting step for producing a prepared solution of a polishing slurry used for finish polishing (hereinafter, referred to as a polishing-slurry finish solution). Specifically, the slurry adjusting section 150 produces the polishing-slurry finish solution that is adjusted so that the number of dried silica particles having a particle size of 1 μm or larger, i.e., silica particles having a composition ratio of Si/O of 50–60 wt %/40–50 wt %, a modulus of elasticity of $1.4 \times 10^{10}$ Pa or higher and a particle size of 1 μm of larger, is 1000 pcs/ml or less. The slurry adjusting section 150 includes a finishing-stock-solution feeder 151, an ultrasonic irradiation section 152, a finishing filtrate feeder 153, a finishing filter 154, and a finish-polishing-solution feeder 155.

The finishing-stock-solution feeder 151 is formed in, for instance, a substantially box-like shape and is connected to the finishing filtrate feeder 153.

Figure 23:
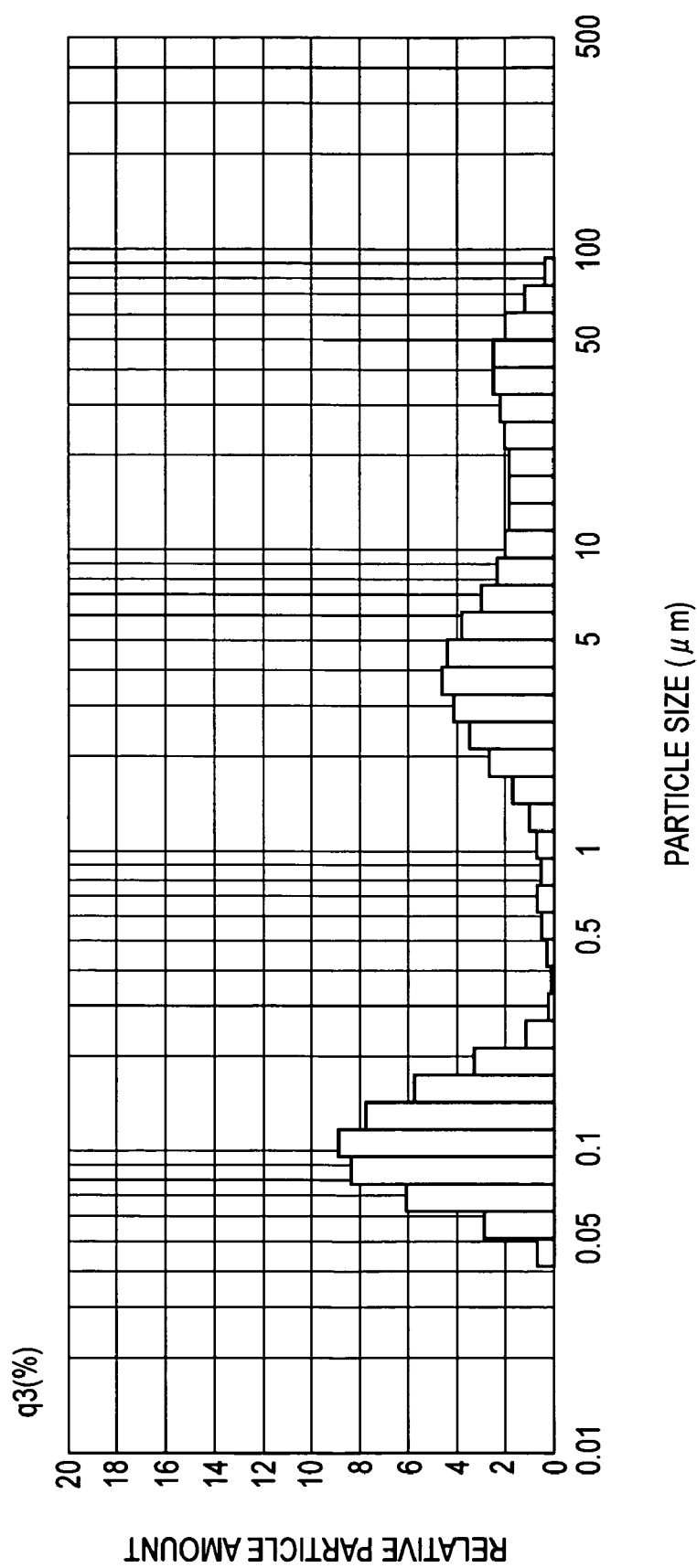
FIG. 23 is a graph showing a particle size distribution of silica particles contained in a related art finishing-slurry stock solution.

A stock solution of a polishing slurry used for the finish polishing and having a particle size distribution as shown in FIG. 23 (hereinafter, referred to as a finishing-slurry stock solution) is stored in the internal space of the finishing-stock-solution feeder 151. The ultrasonic irradiating section 152 irradiates an ultrasonic wave to the finishing-stock-solution feeder 151, which will be described later in detail. The finishing-stock-solution feeder 151 feeds the finishing-slurry stock solution stored in the internal space thereof to the finishing filtrate feeder 153 just after the ultrasonic wave is irradiated by the ultrasonic irradiating section 152.

The ultrasonic irradiating section 152 performs an ultrasonic irradiating stage for irradiating the ultrasonic wave to the finishing-slurry stock solution stored in the finishing-stock-solution feeder 151. The ultrasonic irradiating section 152 includes a mounting section 152A and an irradiation processor 152B.

The mounting section 152A allows the finishing-stock-solution feeder 151 to be mounted thereon.

The irradiation processor 152B vibrates the mounting section 152A by the ultrasonic wave and irradiates the ultrasonic wave of, for instance, 15 kHz to the finishing-slurry stock solution in the finishing-stock-solution feeder 151 mounted on the mounting section 152A for a predetermined time period.

As for the ultrasonic wave irradiated to the finishing-slurry stock solution, since the ultrasonic wave of any MHz unit cannot disperse silica particles aggregated due to the effect of a water-soluble polymer agent, the ultrasonic wave of kHz unit is preferably employed. In addition, when the temperature of the finishing-slurry stock solution exceeds 40° C., an alkaline solution contained in the finishing-slurry stock solution might be evaporated, so that the ultrasonic wave is preferably irradiated to the finishing-slurry stock solution with its temperature maintained at 40° C. or lower.

Accordingly, the irradiation processor 152B irradiates the ultrasonic wave of 15 kHz to the finishing-slurry stock solution.

The finishing filtrate feeder 153 is formed in, for instance, a substantially box-like shape and is connected to the finishing filter 154 and the finish-polishing-solution feeder 155.

The finishing filtrate feeder 153 circulates the finishing-slurry stock solution that is fed from the finishing-stock-solution feeder 151 just after the ultrasonic wave is irradiated thereto such that the finishing-slurry stock solution is filtered, for example, four times with the finishing filter 154, the finishing filtrate feeder 153 thereby adjusting the finishing-slurry stock solution so that the number of dried silica particles having the particle size of 1 μm or larger is 1000 pcs/ml or less and storing the adjusted finishing-slurry stock solution as a finish slurry filtrate. Then, the finishing filtrate feeder 153 feeds the finish slurry filtrate after the four-times filtering to the finish-polishing-solution feeder 155.

Incidentally, the number of filtering is not limited to four, but may be three or less or five or more as long as the finishing-slurry stock solution can be adjusted so that the number of the dried silica particles having the particle size of 1 μm or larger is 1000 pcs/ml or less.

The finishing filter 154 removes the aggregated silica particles and the dried silica particles having a predetermined size or larger contained in the finish-slurry stock solution by filtering.

The finishing filter 154 is capable of capturing solid matters having a particle size of 5 μm or larger with capturing efficiency of 99.99% or more.

The finishing filter 154 may be any filter capable of filtering liquids, e.g., a depth filter and a membrane filter.

The finish-polishing-solution feeder 155 is formed in, for instance, a substantially box-like shape and is connected to a later-described finish polishing section 133 of the polishing section 130.

The finish-polishing-solution feeder 155 stores the finish slurry filtrate fed from the finishing filtrate feeder 153. The finish-polishing-solution feeder 155 adds purified water to the finish slurry filtrate to produce the polishing-slurry finish solution to feed it to the finish polishing section 133.

The finish polishing section 133 performs a finish polishing step for finish-polishing the semiconductor wafer W. The finish polishing section 133 includes, though not shown, a finish polishing pad, a finish-polishing-solution feeder and a finish-polishing holder.

The finish-polishing-solution feeder is connected to the slurry adjusting section 150 to feed the polishing-slurry finish solution from the slurry adjusting section 150 to the finish polishing pad.

The finish polishing pad of the finish polishing section 133 performs finish polishing of the semiconductor wafer W held by the finish polishing holder using the polishing-slurry finish solution fed from the slurry adjusting section 150 via the finish-polishing-solution feeder.

[Operation of Semiconductor Wafer Polishing Device]

Now, as an operation of the polishing device 100 described above, polishing processing of the semiconductor wafer W will be described.

Note that since a primary polishing step and a secondary polishing step will be described in detail in the second embodiment, only the slurry adjusting step and the finish polishing step will be described below.

(Slurry Adjusting Step)

As the polishing processing of the semiconductor wafer W, the slurry adjusting step will be described below.

The polishing device 100 performs the ultrasonic irradiating stage in which the ultrasonic irradiating section 152 of the slurry adjusting section 150 irradiates the ultrasonic wave to the finishing-slurry stock solution stored in the finishing-stock-solution feeder 151. Then, the finishing-stock-solution feeder 151 feeds the finishing-slurry stock solution to the finishing filtrate feeder 153 just after the ultrasonic irradiating stage is completed.

Thereafter, the finishing filtrate feeder 153 performs a filtering stage for filtering the finishing-slurry stock solution four times with the finishing filter 154 to feed the filtered finishing-slurry stock solution to the finish-polishing-solution feeder 155 as the finish slurry filtrate. The finish-polishing-solution feeder 155 produces the polishing-slurry finish solution from the finish slurry filtrate which has been adjusted so that the number of dried silica particles having the particle size of 1 µm or larger is 1000 pcs/ml or less to feed the polishing-slurry finish solution to the finish polishing section 133.

(Finish Polishing Step)

Next, as the polishing processing of the semiconductor wafer W, the finish polishing step will be described below.

The polishing device 100 operates a carrier of the polishing section 130 to move the semiconductor wafer W that has been polished by the secondary polishing section 132 as the secondary polishing, the semiconductor wafer W being held by the finish polishing holder of the finish polishing section 133.

Then, the finish polishing section 133 performs the finish polishing of the semiconductor wafer W using the polishing-slurry finish solution from the slurry adjusting section 150.

[Advantages and Effects of Semiconductor Wafer Polishing Device]

According to the first embodiment described above, the following advantages and effects can be attained.

(1) In the slurry adjusting step, the slurry adjusting section 150 of the polishing device 100 irradiates the ultrasonic wave to the finishing-slurry stock solution and filters the ultrasonic-irradiated finishing-slurry stock solution with the finishing filter 154, thereby producing the polishing-slurry finish solution that has been adjusted so that the number of dried silica particles having the particle size of 1 µm or larger, i.e., the silica particle having the composition ratio of Si/O of 50–60 wt %/40–50 wt %, the modulus of elasticity of $1.4 \times 10^{10}$ Pa or higher and the particle size of 1 µm or larger, is 1000 pcs/ml or less. Then, in the finish polishing step, the finish polishing section 133 performs the finish polishing of the semiconductor wafer W using the polishing-slurry finish solution fed from the slurry adjusting section 150.

By irradiating the ultrasonic wave to the finishing-slurry stock solution, the silica particles with large particle sizes, which are generated by aggregation due to the effect of the water-soluble polymer agent contained in the finishing-slurry stock solution, can be dispersed. Then, by filtering with the finishing filter 154 the finishing-slurry stock solution with the silica particles dispersed, clogging of the finishing filter 154 can be prevented, so that the dried silica particles can be selectively removed. Therefore, reduction in specific gravity of the polishing-slurry finish solution can be prevented, thereby preventing significant degradation of the polishing performances.

In the finish polishing step, the finishing-slurry stock solution is adjusted by the ultrasonic irradiation and filtering so that the number of silica particles having the composition ratio of Si/O of 50–60 wt %/40–50 wt %, the modulus of elasticity of $1.4 \times 10^{10}$ Pa or higher and the particle size of 1 µm or larger, i.e., the dried silica particles having the particle sizes of 1 µm or larger, is 1000 pcs/ml or less. Accordingly, the number of minute defects generated when the adjusted finishing-slurry stock solution is used in the finish polishing step can be controlled to a predetermined number or less.

Therefore, the semiconductor wafer can be polished properly.

(2) In the ultrasonic irradiating stage of the ultrasonic irradiating section 152, the ultrasonic is irradiated to the finishing-slurry stock solution with its temperature maintained at 40° C. or lower.

Thus, the silica particles having large particle sizes generated due to the effect of the water-soluble polymer agent can be dispersed while the evaporation due to heat of the alkaline solution contained in the finishing-slurry stock solution can be securely prevented.

(3) In the filtering stage performed by the finishing filtrate feeder 153 and the finishing filter 154, the finishing-slurry stock solution just after the ultrasonic-irradiation in the ultrasonic irradiating stage is filtered.

Therefore, the silica particles dispersed by the ultrasonic wave can be filtered before the silica particles are re-aggregated due to the effect of the water-soluble polymer agent, thereby preventing clogging of the finishing filter 154 more securely.

SECOND EMBODIMENT

Now, the second embodiment of the present invention will be described below with reference to the attached drawings.

In the description below, the same reference numerals will be attached to the structures and components which are the same as the first embodiment to omit or simplify the detailed description thereof.

[Arrangement of Semiconductor Wafer Polishing Device]

Figure 2:
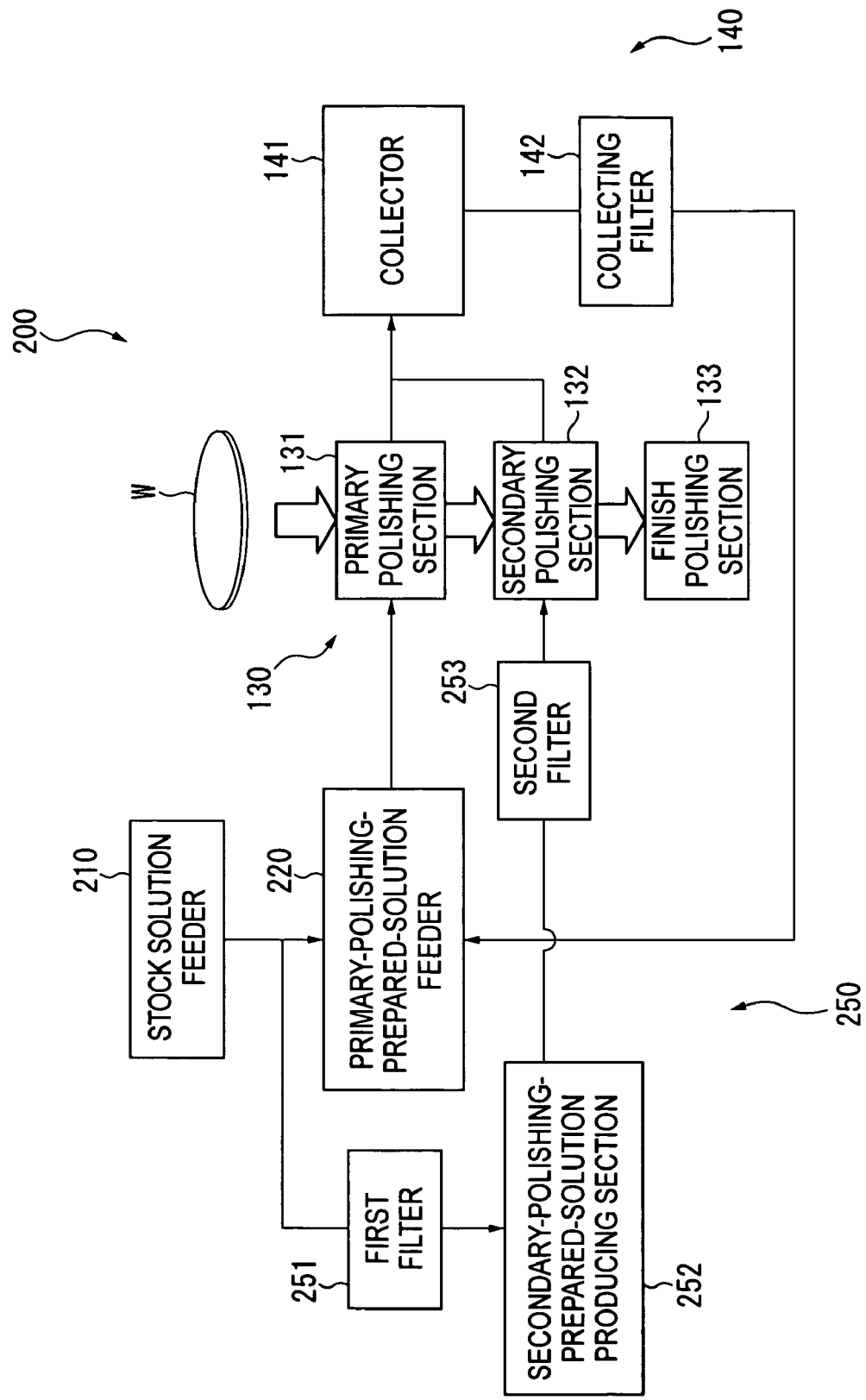
FIG. 2 is a block diagram showing an outline of a polishing device of a semiconductor wafer according to a second embodiment of the present invention.

FIG. 2 is a block diagram showing an outline of a polishing device 200 of the semiconductor wafer W of the second embodiment.

A stock solution feeder 210 is made of, for instance, a PFA (tetrafluoroethylene-perfluoroalkylvinyl ether copolymer) and formed in a substantially box-like shape, the stock solution feeder 210 being connected to a primary-polishing-prepared-solution feeder 220 and a slurry adjusting section 250.

Figure 19:
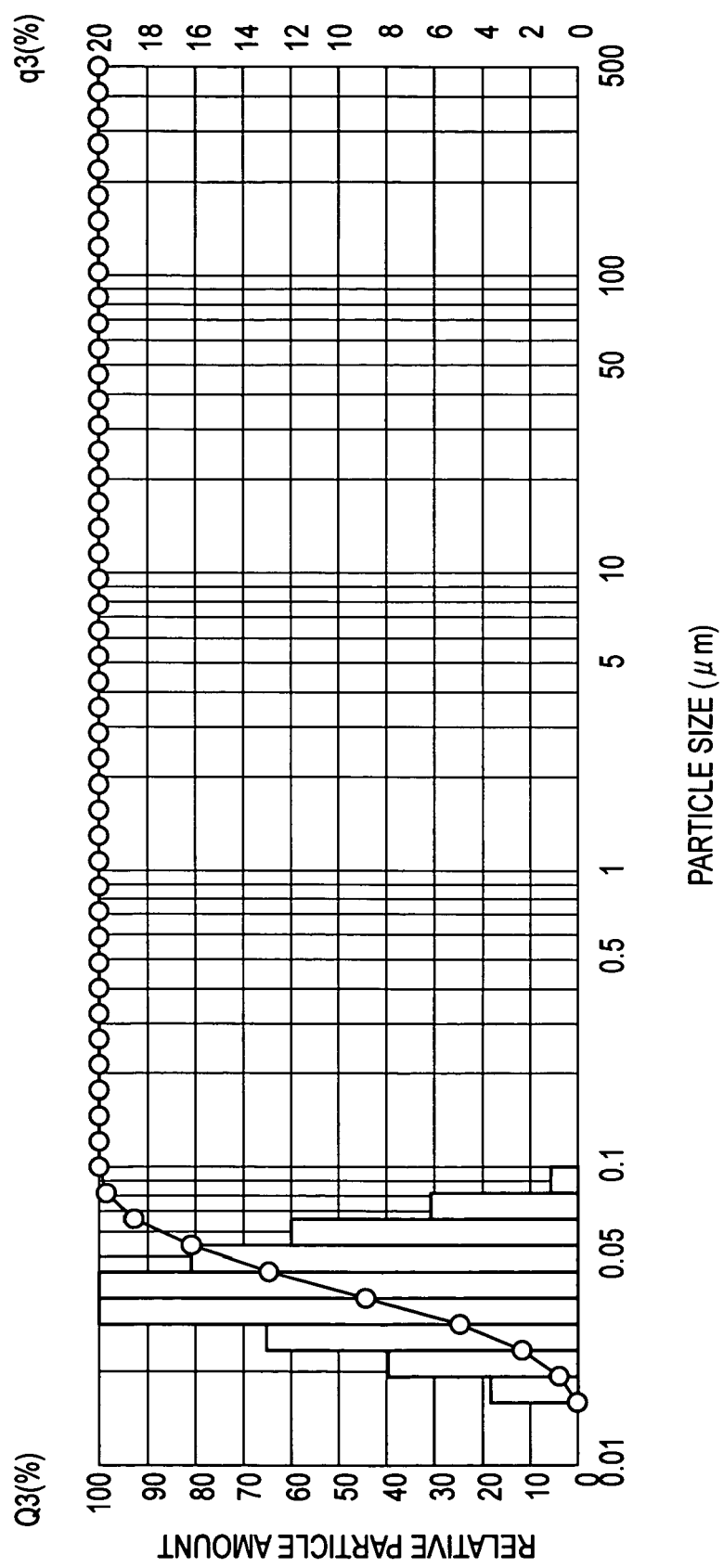
FIG. 19 is a graph showing a particle size distribution of silica particles contained in a related art polishing-slurry stock solution.
Figure 20:
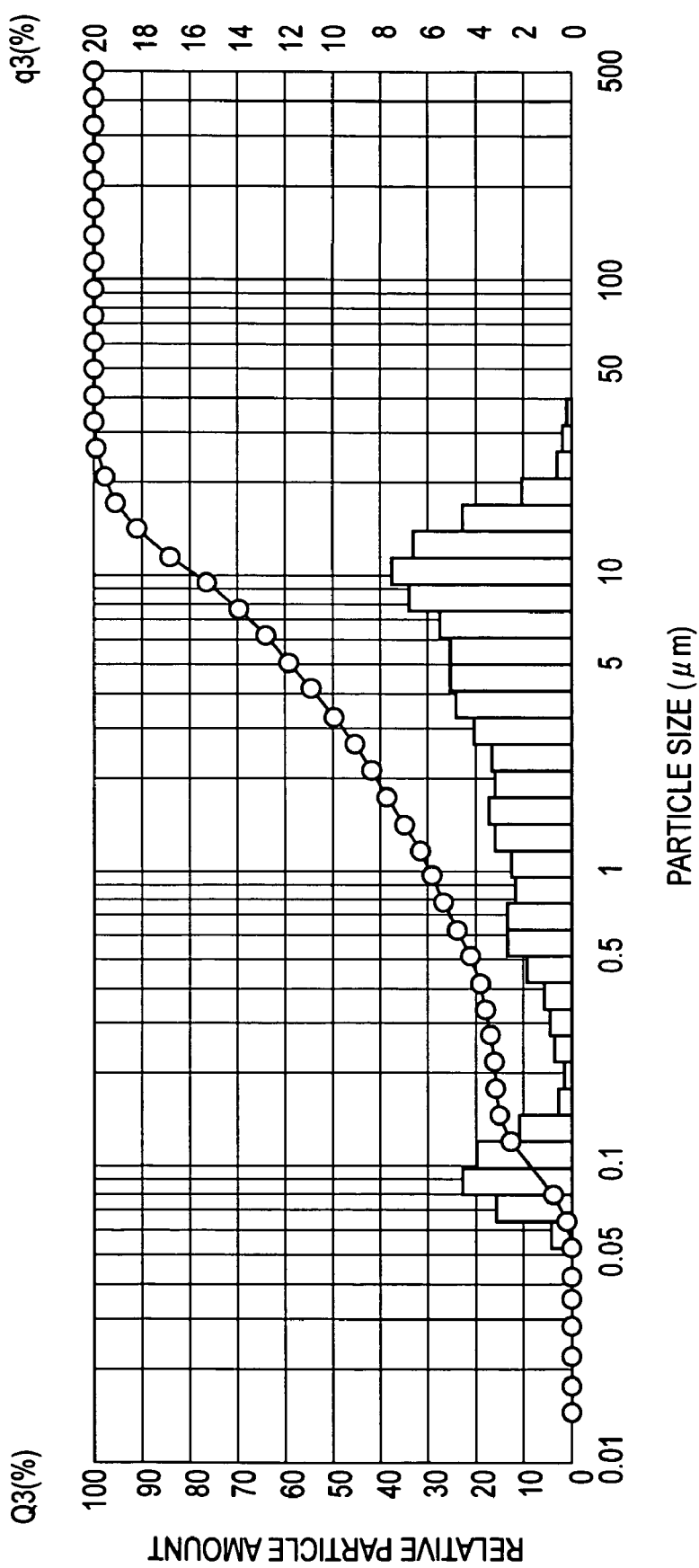
FIG. 20 is a graph showing a particle size distribution of silica particles contained in a related art recycled slurry solution.
Figure 21:
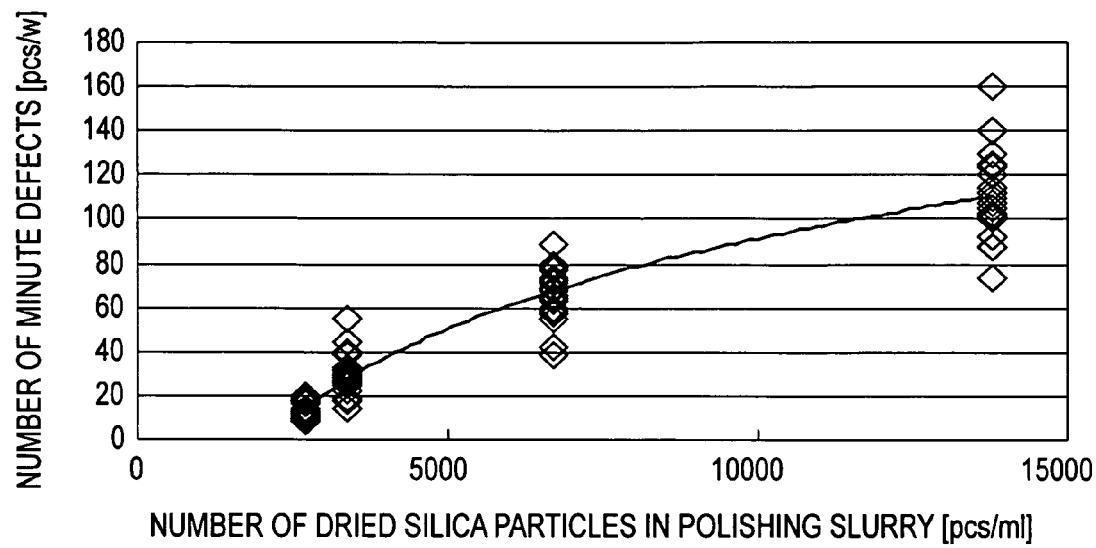
FIG. 21 is a graph showing how the number of dried silica particles contained in a related art polishing slurry relates with the number of minute defects generated at the time of polishing using this polishing slurry.
Figure 22:
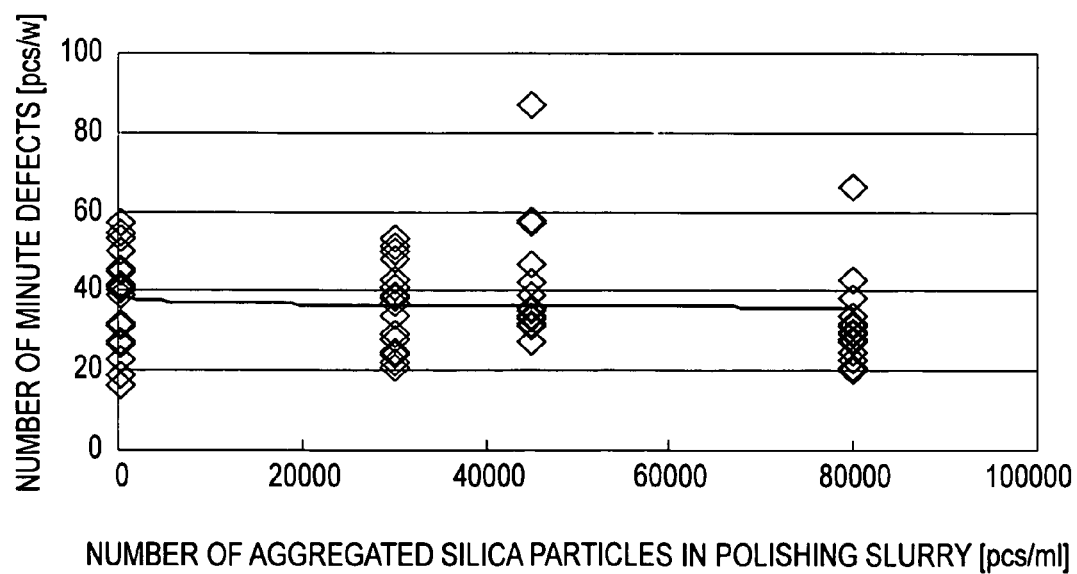
FIG. 22 is a graph showing how the number of aggregated silica particles contained in a related art polishing slurry relates with the number of minute defects generated at the time of polishing using this polishing slurry.

The stock solution feeder 210 is hermetically sealed and humidity of the internal space thereof is controlled to be 99% or higher. A rough-polishing-slurry stock solution having a particle size distribution as shown in FIG. 19 is stored in the internal space of the stock solution feeder 210. The stock solution feeder 210 feeds the polishing-slurry stock solution stored in the internal space thereof to the primary-polishing-prepared-solution feeder 220 or the slurry adjusting section 250.

The primary-polishing-prepared-solution feeder 220 is formed in, for instance, a substantially box-like shape and is connected to the polishing section 130 and the collecting section 140.

The primary-polishing-prepared-solution feeder 220 stores a polishing-slurry stock solution fed from the stock solution feeder 210. Then, the primary-polishing-prepared-solution feeder 220 adds purified water to the polishing-slurry stock solution to prepare a prepared solution of a polishing slurry used in the later-described primary polishing (hereinafter, referred to as a primary-polishing-slurry prepared solution), the primary-polishing-prepared-solution feeder 220 feeding the primary-polishing-slurry prepared solution to the polishing section 130.

The primary-polishing-prepared-solution feeder 220 stores a later-described polishing-slurry collected filtrate used in the polishing in the polishing section 130 and fed from the collecting section 140, the primary-polishing-prepared-solution feeder 220 feeding the polishing-slurry collected filtrate to the polishing section 130 as the primary-polishing-slurry prepared solution.

The polishing section 130 polishes the semiconductor wafer W. The polishing section 130 includes the primary polishing section 131, the secondary polishing section 132, the finish polishing section and a carrier (not shown). Since the primary polishing section 131, the secondary polishing section 132 and the finish polishing section 133 have the arrangement similar to each other, only the primary polishing section 131 will be described in detail, while the secondary polishing section 132 and the finish polishing section 133 will be described simply.

The carrier includes a mounting section on which the semiconductor wafer W is mounted and a moving section for moving the mounting section. The moving section of the carrier moves the semiconductor wafer W mounted on the mounting section to carry the semiconductor wafer W to the primary polishing section 131, to the secondary polishing section 132 and to the finish polishing section 133 sequentially.

The primary polishing section 131 performs a primary polishing step for roughly polishing the semiconductor wafer W to have a predetermined smoothness. The primary polishing section 131 includes, though not shown, a primary polishing pad, a primary-polishing-solution feeder, a primary polishing holder and a primary-polishing outlet port.

The primary polishing pad is impregnated with a polyurethane resin and is arranged to perform the primary polishing of the semiconductor wafer W.

The primary-polishing-solution feeder is connected to the primary-polishing-prepared-solution feeder 220 so as to feed the primary-polishing-slurry prepared solution from the prepare-primary-polishing-solution feeder 220 to the primary polishing pad.

The primary polishing holder holds the semiconductor wafer W carried by the carrier.

The primary-polishing outlet port is connected to the collecting section 140 so as to discharge the primary-polishing prepared solution used in the primary polishing to the collecting section 145.

The primary polishing pad of the primary polishing section 131 performs the primary polishing of the semiconductor wafer W held by the primary polishing holder using the primary-polishing-slurry prepared solution fed from the primary-polishing-prepared-solution feeder 220 via the primary-polishing-solution feeder, and the primary polishing section 131 discharges the used primary-polishing-slurry prepared solution to the collecting section 140.

Here, the primary-polishing-slurry prepared solution discharged from the primary polishing section 131 contains a lot of aggregated silica particles having been generated when a high pressure is applied to the primary-polishing-slurry prepared solution during the primary polishing. Also, the primary-polishing-slurry prepared solution contains a lot of dried silica particles generated when the primary-polishing-slurry prepared solution is exposed to the ambient air and dried.

The secondary polishing section 132 performs a secondary polishing step for roughly polishing the semiconductor wafer W to have more smoothness than the primary polishing. Here, the secondary polishing performed by the secondary polishing section 132 corresponds to a rough polishing step just before a finish polishing step of the present invention. The secondary polishing section 132 includes, though not shown, a secondary polishing pad, a secondary-polishing-solution feeder, a secondary polishing holder and a secondary outlet port.

The secondary-polishing-solution feeder is connected to the slurry adjusting section 250 so as to feed a later-described secondary-polishing-slurry adjusted solution that has been adjusted in the slurry adjusting section 250 to the secondary polishing pad.

The secondary polishing outlet port is connected to the collecting section 140 so as to discharge the secondary-polishing-slurry adjusted solution used in the secondary polishing to the collecting section 140.

The secondary polishing pad of the secondary polishing section 132 performs the secondary polishing of the semiconductor wafer W held by the secondary polishing holder using the secondary-polishing-slurry adjusted solution fed from the slurry adjusting section 250 via the secondary-polishing-solution feeder, and the secondary polishing section 132 discharges the used secondary-polishing-slurry adjusted solution to the collecting section 140.

Here, a machining allowance of the secondary polishing is set to 2 µm or less, which is a typical value.

The secondary-polishing-slurry adjusted solution discharged from the secondary polishing section 132 contains a lot of aggregated silica particles and dried silica particles generated due to the same phenomena as those occurring in the primary polishing section 131.

The collecting section 140 processes the primary-polishing-slurry prepared solution and the secondary-polishing-slurry adjusted solution used in the polishing section 130 so as to be reusable in the primary polishing section 131, the collecting section 140 then feeding the processed solution to the primary-polishing-prepared-solution feeder 220 as a polishing-slurry collected filtrate. The collecting section 140 includes a collector 141 and a collecting filter 142.

The collector 141 is formed in, for instance, a substantially box-like shape and is connected to the collecting filter 142.

The collector 141 stores the primary-polishing-slurry prepared solution used in the primary polishing section 131 and the secondary-polishing-slurry adjusted solution used in the secondary polishing section 132, and feeds them to the collecting filter 142. Here, the used primary-polishing-slurry prepared solution and secondary-polishing-slurry adjusted solution are referred to as a polishing-slurry collected solution when being described collectively.

The collecting filter 142 is connected to the primary-polishing-prepared-solution feeder 220.

The collecting filter 142 removes by filtering the aggregated silica particles and the dried silica particles having a predetermined size or larger contained in the polishing-slurry collected solution from the collector 141.

Here, the polishing-slurry collected filtrate fed to the primary-polishing-prepared-solution feeder 220 is only used in the primary polishing step, but not in the secondary polishing step and the finish polishing step. Even when a lot of minute defects are generated on the semiconductor wafer W in the primary polishing step, the minute defects are polished in the secondary polishing step and the finish polishing step, thereby no problem arises. Accordingly, a size of the solid matters to be removed by the collecting filter 142 is set to be a predetermined size that allows a polishing rate in the primary polishing step to be a predetermined level or higher even though a lot of minute defects are generated.

The collecting filter 142 feeds the polishing-slurry collected solution from which the aggregated silica particles and the dried silica particles having the predetermined size or larger are removed to the primary-polishing-prepared-solution feeder 220 as the polishing-slurry collected filtrate.

The collecting filter 142 may be any filter capable of filtering liquids, e.g., a depth filter and a membrane filter.

The slurry adjusting section 250 performs slurry adjusting step for producing the secondary-polishing-slurry adjusted solution that has been adjusted so that the number of dried silica particles having the particle size of 1 μm or larger, i.e., the silica particles having the composition ratio of Si/O of 50–60 wt %/40–50 wt %, a modulus of elasticity of $1.4 \times 10^{10}$ Pa or higher and the particle size of 1 μm or larger, is 1000 pcs/ml or less. The slurry adjusting section 250 includes a first filter 251, a secondary-polishing-prepared-solution producing section 252 and a second filter 253.

The first filter 251 is capable of capturing solid matters having a particle size of 5 μm or larger with capturing efficiency of 99.99% or higher, the first filter 251 being connected to the stock solution feeder 210 and the secondary-polishing-prepared-solution producing section 252.

Here, the largest particle size of the primary particles of silica contained in the polishing-slurry stock solution is 0.1 μm as shown in FIG. 19. The first filter 251 can capture the solid matters having a size equal to or more than fifty times as large as the primary particles of the silica contained in the polishing-slurry stock solution with the capturing efficiency of 99.99% or higher.

The first filter 251 removes by filtering the solid matters having the particle size of 5 μm or larger contained in the polishing-slurry stock solution fed from the stock solution feeder 210, and feeds it to the secondary-polishing-prepared-solution producing section 252.

The first filter 251 may have the same arrangement as the collecting filter 142.

The secondary-polishing-prepared-solution producing section 252 is formed in, for instance, a substantially box-like shape and is connected to the second filter 253.

The secondary-polishing-prepared-solution producing section 252 stores the polishing-slurry stock solution fed from the first filter 251, from which the solid matters having the size of 5 μm or larger have been removed. Then, secondary-polishing-prepared-solution producing section 252 properly adds purified water to the polishing-slurry stock solution to produce a secondary-polishing-slurry prepared solution, which is fed to the second filter 253.

The second filter 253 can capture solid matters having a particle size of 1 μm or larger, i.e., the solid matters having the size equal to or more than ten times as large as the primary particles of the silica contained in the polishing-slurry stock solution with the capturing efficiency of 99.99% or higher, the second filter 253 being connected to the secondary polishing section 132.

The second filter 253 removes by filtering the solid matters having the size of 1 μm or larger contained in the secondary-polishing-slurry prepared solution fed from the secondary-polishing-prepared-solution producing section 252, and feeds the secondary-polishing-slurry prepared solution to the secondary polishing section 132 as the secondary-polishing-slurry adjusted solution.

The second filter 253 may have the same arrangement as the collecting filter 142 and the first filter 251.

[Operation of Semiconductor Wafer Polishing Device]

Now, as an operation of the polishing device 200 described above, polishing processing of the semiconductor wafer W will be described.

Incidentally, the finish polishing step is the same as that in the above-described embodiment, only the primary polishing step, the slurry adjusting step and the secondary polishing step will be described.

(Primary Polishing Step)

First, as the polishing processing of the semiconductor wafer W, the primary polishing step will be described.

The polishing device 200 operates the carrier of the polishing section 130 to move the semiconductor wafer W to be polished, the semiconductor wafer W being held by the primary polishing holder of the primary polishing section 131.

Then, the primary-polishing-prepared-solution feeder 220 produces the primary-polishing-slurry prepared solution from the polishing-slurry stock solution fed from the stock solution feeder 210, and feeds the primary-polishing-slurry prepared solution to the primary polishing section 131. Then, the primary-polishing-prepared-solution feeder 220 feeds the polishing-slurry collected filtrate fed from the collecting section 140 to the primary polishing section 131 as the primary-polishing-slurry prepared solution.

Thereafter, the primary polishing section 131 performs the primary polishing of the semiconductor wafer W using the primary-polishing-slurry prepared solution fed from the primary-polishing-prepared-solution feeder 220 and containing a lot of aggregated silica particles and dried silica particles, while discharging the used primary-polishing-slurry prepared solution to the collecting section 140.

As described, since the primary-polishing-slurry prepared solution contains a lot of dried silica particles, a lot of minute defects will be generated by the primary polishing. However, since the minute defects are polished in the secondary polishing, the primary polishing can be performed using the polishing-slurry collected filtrate as the primary-polishing-slurry prepared solution.

(Slurry Adjusting Step)

Next, as the polishing processing of the semiconductor wafer W, the slurry adjusting step will be described.

The polishing device 200 operates the stock solution feeder 210 to feed the polishing-slurry stock solution to the slurry adjusting section 250.

The slurry adjusting section 250 performs a stock-solution filtering step for filtering the fed polishing-slurry stock solution with the first filter 251. Thereafter, the secondary-polishing-prepared-solution producing section 252 performs a secondary-polishing-prepared-solution producing step as the slurry producing step for producing the secondary-polishing-slurry prepared solution from the polishing-slurry stock solution filtered by the first filter 251. Then, the second filter 253 performs a prepared-solution filtering step for filtering the secondary-polishing-slurry prepared solution produced by the secondary-polishing-prepared-solution producing section 252 to adjust the secondary-polishing-slurry prepared solution so that the number of dried silica particles having the particle size of 1 μm or larger is 3000 pcs/ml or less, which is fed to the secondary polishing section 132 as the secondary-polishing-slurry adjusted solution.

(Secondary Polishing Step)

Next, as the polishing processing of the semiconductor wafer W, the secondary polishing step will be described.

The polishing device 200 operates the carrier of the polishing section 130 to move the semiconductor wafer W that has been polished by the primary polishing section 131 as the primary polishing, the semiconductor wafer W being held by the secondary polishing holder of the secondary polishing section 132.

Then, the secondary polishing section 132 performs the secondary polishing of the semiconductor wafer W using the secondary-polishing-slurry adjusted solution from the slurry adjusting section 250, while discharging the used secondary-polishing-slurry adjusted solution to the collecting section 140.

[Advantages and Effects of Semiconductor Wafer Polishing Device]

According to the second embodiment described above, the following advantages and effects can be attained.

(4) In the slurry adjusting step, the slurry adjusting section 250 of the polishing device 200 feeds to the secondary polishing section 132 the secondary-polishing-slurry adjusted solution that has been adjusted so that the number of dried silica particles having the particle size of 1 μm or larger, i.e., the silica particles having the composition ratio of Si/O of 50–60 wt %/40–50 wt %, the modulus of elasticity of $1.4 \times 10^{10}$ Pa or higher and the particle size of 1 μm or larger, is 1000 pcs/ml or less. Then, in the secondary polishing step, the secondary polishing section 132 performs the secondary polishing of the semiconductor wafer W using the secondary-polishing-slurry adjusted solution fed from the slurry adjusting section 250.

Thus, since a content of the dried silica particles in the secondary-polishing-slurry adjusted solution used in the secondary polishing step just before the finish polishing step is adjusted, the polishing rate can be enhanced and the number of minute defects generated in the secondary polishing step can be reduced as compared to an arrangement for adjusting contents of the aggregated silica particles and the dried silica particles.

The lower limit of the particle size of which content is adjusted is set to 1 μm, which is the maximum value of the machining allowance in the finish polishing step. Accordingly, as compared to an arrangement in which the lower limit is set to be higher than 1 μm, heights of the minute defects generated in the secondary polishing step are easily adjusted to 1 μm or less, thereby realizing effective finish polishing.

In addition, since the upper limit of the content to be adjusted is set to 3000 pcs/ml or less, the number of minute defects generated in the secondary polishing step can be controlled to a predetermined number or less.

Therefore, the semiconductor wafer W can be polished properly.

(5) The slurry adjusting step includes: the stock-solution filtering step in which the first filter 251 filters the polishing-slurry stock solution; the secondary-polishing-prepared-solution producing step in which the secondary-polishing-prepared-solution producing section 252 produces the secondary-polishing-slurry prepared solution from the polishing-slurry stock solution filtered in the stock-solution filtering step; and a prepared-solution filtering step in which the second filter 253 filters the secondary-polishing-slurry prepared solution.

Thus, with a simple arrangement for providing the first filter 251 and the second filter 253 to the slurry adjusting step, the secondary-polishing-slurry adjusted solution can be adjusted as described above so as to properly polish the semiconductor wafer W.

Even when the dried silica particles are generated while the stock solution feeder 210 stores the polishing-slurry stock solution, the dried silica particles having a predetermined size or larger are removed in the stock-solution filtering step, the number of dried silica particles contained in the secondary-polishing-slurry prepared solution produced in the secondary-polishing-prepared-solution producing step can be reduced. In addition, the size of dried silica particles which are difficult to be removed can be minimized. Therefore, as compared to an arrangement without the stock-solution filtering step, the number of dried silica particles to be captured in the prepared-solution filtering step can be reduced, so that clogging of the second filter 253 in the prepared-solution filtering step can be prevented, thereby effectively adjusting the secondary-polishing-slurry prepared solution.

(6) The first filter 251 can capture the solid matters having the size equal to or more than fifty times as large as the primary particles of the silica contained in the polishing-slurry stock solution with the capturing efficiency of 99.99% or higher. While, the second filter 253 can capture the solid matters having the size equal to or more than ten times as large as the primary particles of the silica with the capturing efficiency of 99.99% or higher.

Therefore, since the first filter 251 and the second filter 253 having the capturing performances as described above are used, the secondary-polishing-slurry prepared solution can be adjusted more effectively as compared to an arrangement using filters with other capturing performances.

(7) The stock solution feeder 210 is hermetically sealed and the humidity of the internal space thereof is controller to be 99% or higher.

Accordingly, generation of the dried silica particles at the boundary between an internal wall of the stock solution feeder 210 and the polishing-slurry stock solution can be prevented.

Therefore, the number of dried silica particles contained in the secondary-polishing-slurry adjusted solution can further be reduced.

THIRD EMBODIMENT

Now, the third embodiment of the present invention will be described below with reference to the attached drawings.

In the description below, the same reference numerals will be attached to the structures and components which are the same as the first and second embodiments to omit or simplify the detailed description thereof.

[Arrangement of Semiconductor Wafer Polishing Device]

Figure 3:
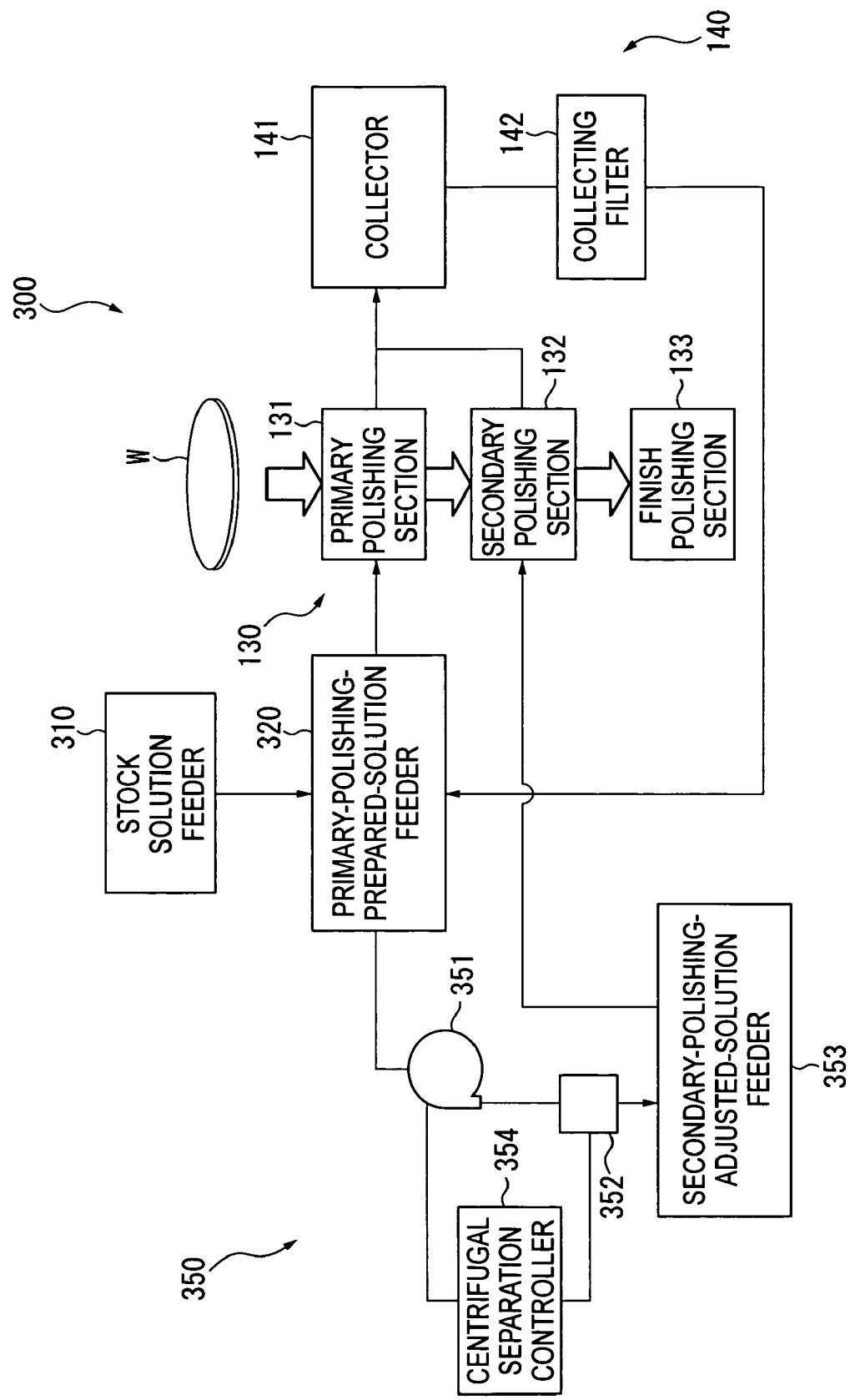
FIG. 3 is a block diagram showing an outline of a polishing device of a semiconductor wafer according to a third embodiment of the present invention.

FIG. 3 is a block diagram showing an outline of a polishing device 300 of the semiconductor wafer W of the third embodiment.

As shown in FIG. 3, the polishing device 300 includes a stock solution feeder 310, a primary-polishing-prepared-solution feeder 320, the polishing section 130, the collecting section 140 and a slurry adjusting section 350.

The stock solution feeder 310 is made of PFA and formed in, for instance, a substantially box-like shape, the stock solution feeder 310 connected to the primary-polishing-prepared-solution feeder 320.

The humidity of the internal space of the stock solution feeder 310 is not particularly controlled. The stock solution feeder 310 feeds a polishing-slurry stock solution stored in the internal space thereof to the primary-polishing-prepared-solution feeder 320.

The primary-polishing-stock-solution feeder 320 is formed in, for instance, a substantially box-like shape and is connected to the polishing section 130, the collecting section 140 and the slurry adjusting section 350.

Then, the primary-polishing-prepared-solution feeder 320 produces a primary-polishing-slurry prepared solution from the polishing-slurry stock solution fed from the stock solution feeder 310, and feeds the primary-polishing-slurry prepared solution to the polishing section 130.

The primary-polishing-prepared-solution feeder 320 stores a polishing-slurry collected filtrate fed from the collecting section 140 and containing a lot of aggregated silica particles and dried silica particles, the primary-polishing-prepared-solution feeder 320 feeding the polishing-slurry collected filtrate to the polishing section 130 as the primary-polishing-slurry prepared solution.

In addition, the primary-polishing-prepared-solution feeder 320 feeds the above-described primary-polishing-slurry prepared solution to the slurry adjusting section 350.

The primary-polishing-solution feeder provided to the primary polishing section 131 of the polishing section 130 is connected to the primary-polishing-prepared-solution feeder 320 so as to feed the primary-polishing-slurry prepared solution to the primary polishing pad.

The secondary-polishing-solution feeder provided to the secondary polishing section 132 of the polishing section 130 is connected to the slurry adjusting section 350 so as to feed the secondary-polishing-slurry adjusted solution that has been adjusted in the slurry adjusting section 350 to the secondary polishing pad.

The collecting filter 142 provided to the collecting section 140 is connected to the primary-polishing-prepared-solution feeder 320 so as to feed the polishing-slurry collected filtrate to the primary-polishing-prepared-solution feeder 320.

The slurry adjusting section 350 performs a slurry adjusting step for producing the secondary-polishing-slurry adjusted solution which has been adjusted so that the number of dried silica particles having the particle size of 1 µm or larger is 3000 pcs/ml or less. Then, the slurry adjusting section 350 includes a centrifugal separator 351, a liquid-borne particle counter 352, a secondary-polishing-adjusted-solution feeder 353 and a centrifugal separation controller 354.

The centrifugal separator 351 is capable of continuously processing fluid, the centrifugal separator 351 being connected to the primary-polishing-prepared-solution feeder 320, the liquid-borne particle counter 352 and the centrifugal separation controller 354.

The centrifugal separator 351 processes, under the control of the centrifugal separation controller 354, the primary-polishing-slurry prepared solution fed from the primary-polishing-prepared-solution feeder 320 with a centrifugal force of 5000 G to 10000 G to produce the secondary-polishing-slurry adjusted solution which has been adjusted so that the number of dried silica particles having the particle sizes of 1 µm or larger is 3000 pcs/ml or less. The centrifugal separator 351 mainly centrifugalize, by utilizing differences in density between the aggregated silica particles and the dried silica particles contained in the primary-polishing-slurry prepared solution, the dried silica particles having the particle size of 1 µm or larger with the centrifugal force to produce the secondary-polishing-slurry adjusted solution.

Then, the centrifugal separator 351 feeds the secondary-polishing-slurry adjusted solution to the liquid-borne particle counter 352.

The liquid-borne particle counter 352 is connected to the secondary-polishing-adjusted-solution feeder 353 and the centrifugal separation controller 354.

The liquid-borne particle counter 352 counts the numbers of aggregated silica particles and dried silica particles contained in the secondary-polishing-slurry adjusted solution fed from the centrifugal separator 351, for example, per a predetermined time period, and outputs a signal representing the counting result to the centrifugal separation controller 354. Then, the liquid-borne particle counter 352 feeds the secondary-polishing-slurry adjusted solution after the counting to the secondary-polishing-adjusted-solution feeder 353.

The secondary-polishing-adjusted-solution feeder 353 is formed in, for instance, a substantially box-like shape and is connected to the secondary polishing section 132.

The secondary-polishing-adjusted-solution feeder 353 stores the secondary-polishing-slurry adjusted solution fed from the centrifugal separator 351 via the liquid-borne particle counter 352 and feeds the secondary-polishing-slurry adjusted solution to the secondary polishing section 132.

The centrifugal separation controller 354 controls the operation of the centrifugal separator 351 based on the counting result by the liquid-borne particle counter 352.

Specifically, when receiving a signal indicating that the counting result by the liquid-borne particle counter 352 is within a predetermined range, the centrifugal separation controller 354 determines that the dried silica particles are centrifugalized so that the number of dried silica particles having the particle size of 1 µm or larger is 3000 pcs/ml or less and determines not to change the centrifugal force of the centrifugal separator 351.

While, when receiving a signal indicating that the counting result of the liquid-borne particle counter 352 is the number exceeding the predetermined range, the centrifugal separation controller 354 determines that the dried silica particles are centrifugalized so that the number of dried silica particles having the particle size of 1 µm or larger is 3000 pcs/ml or more and changes the centrifugal force of the centrifugal separator 351 so as to centrifugalize more dried silica particles. Namely, the centrifugal separation controller 354 increases the centrifugal force of the centrifugal separator 351.

On the other hand, when acquiring a signal indicating that the counting result is the number below the predetermined range, the centrifugal separation controller 354 determines that a lot of aggregated silica particles are centrifugalized in addition to the dried silica particles. When the number of aggregated silica particles is reduced, the polishing rate is lowered, so that the centrifugal separation controller 354 changes the centrifugal force of the centrifugal separator 351 so as to reduce the aggregated silica particles to be centrifugalized. Namely, the centrifugal separation controller 354 reduces the centrifugal force of the centrifugal separator 351.

[Operation of Semiconductor Wafer Polishing Device]

Now, as an operation of the polishing device 300 described above, polishing processing of the semiconductor wafer W will be described.

Incidentally, the primary polishing step, the secondary polishing step and the finish polishing step are the same as those in the above-described embodiments, only the slurry adjusting step will be described.

(Slurry Adjusting Step)

As the polishing processing of the semiconductor wafer W, the slurry adjusting step will be described below.

The polishing device 300 operates the primary-polishing-prepared-solution feeder 320 to feed the primary-polishing-slurry prepared solution to the slurry adjusting section 350. Here, as described above, the primary-polishing-slurry prepared solution contains a lot of aggregated silica particles and dried silica particles.

The slurry adjusting section 350 performs a centrifugalizing step for processing the fed primary-polishing-slurry prepared solution with the centrifugal separator 351. Specifically, the slurry adjusting section 350 mainly centrifugalizes the dried silica particles from the primary-polishing-slurry prepared solution to produce the secondary-polishing-slurry adjusted solution that has been adjusted so that the number of dried silica particles having the particle sizes of 1 μm or larger is 3000 pcs/ml or less.

Thereafter, the slurry adjusting section 350 feeds the secondary-polishing-slurry adjusted solution to the secondary-polishing-slurry-adjusted-solution feeder 353 via the liquid-borne particle counter 352, while adjusting the centrifugal force of the centrifugal separator 351 in accordance with the numbers of aggregated silica particles and dried silica particles contained in the secondary-polishing-slurry adjusted solution and counted by the liquid-borne particle counter 352. Then, the secondary-polishing-adjusted-solution feeder 353 feeds the secondary-polishing-slurry adjusted solution to the secondary polishing section 132.

[Advantages and Effects of Semiconductor Wafer Polishing Device]

According to the above-described third embodiment, the following advantages and effects can be attained in addition to (4) in the second embodiment.

(8) The slurry adjusting step includes the centrifugalizing step for centrifugalizing the primary-polishing-slurry prepared solution with the centrifugal separator 351.

Accordingly, by utilizing the difference in density between the dried silica particles and the aggregated silica particles for mainly centrifugalizing the dried silica particles from the primary-polishing-slurry prepared solution, the secondary-polishing-slurry adjusted solution that has been adjusted so that the number of dried silica particles having the particle size of 1 μm or larger is 3000 pcs/ml or less can be produced.

In addition, the used polishing-slurry collected filtrate can be reused in the secondary polishing step, so that usage amount of the polishing-slurry stock solution can be reduced.

(9) The centrifugal force of the centrifugal separator 351 is set to 5000 G to 10000 G.

Accordingly, since the lower limit of the centrifugal force in the centrifugalizing step is set to 5000 G, the dried silica particles can be centrifugalized and removed so as to reduce the number of minute defects. On the other hand, since the upper limit of the centrifugal force is set to 10000 G, the number of aggregated silica particles to be centrifugalized and removed can be minimized, so that the secondary polishing can be performed without lowering the polishing rate.

(10) The slurry adjusting section 350 includes: the liquid-borne particle counter 352 for counting the numbers of aggregated silica particles and dried silica particles contained in the secondary-polishing-slurry prepared solution produced by the centrifugal separator 351; and the centrifugal separation controller 354 for adjusting the centrifugal force of the centrifugal separator 351 based on the counting result by the liquid-borne particle counter 352.

Accordingly, centrifugalizing condition of the centrifugal separator 351 can be controlled in accordance with a condition of the produced secondary-polishing-slurry adjusted solution, so that the secondary-polishing-slurry adjusted solution with consistent quality can be constantly fed to the secondary polishing section 132.

FOURTH EMBODIMENT

Now, the fourth embodiment of the present invention will be described below with reference to the attached drawings.

In the description below, the same reference numerals will be attached to the structures and components which are the same as the first to third embodiments to omit or simplify the detailed description thereof.

[Arrangement of Semiconductor Wafer Polishing Device]

Figure 4:
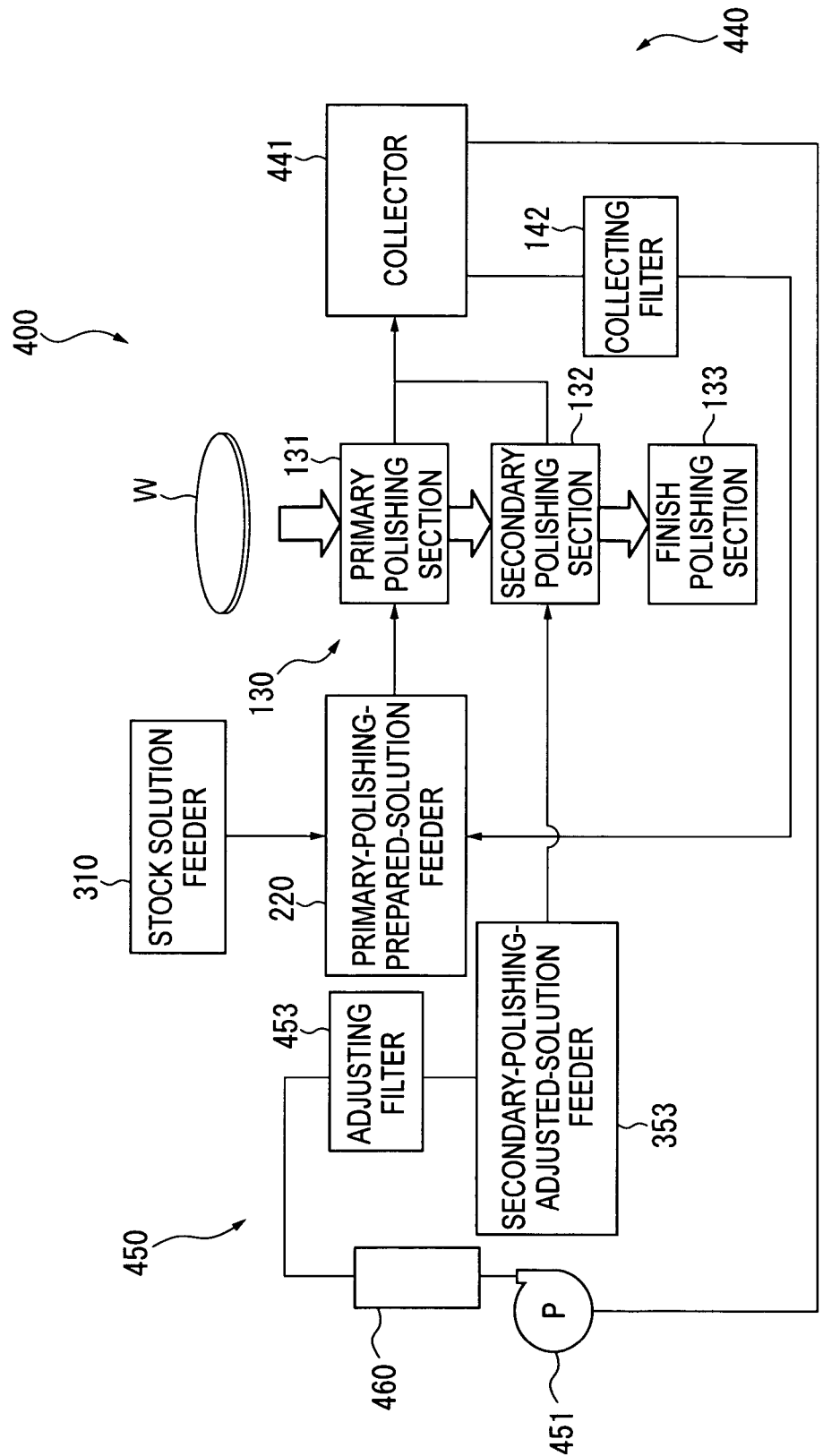
FIG. 4 is a block diagram showing an outline of a polishing device of a semiconductor wafer according to a fourth embodiment of the present invention.
Figure 5:
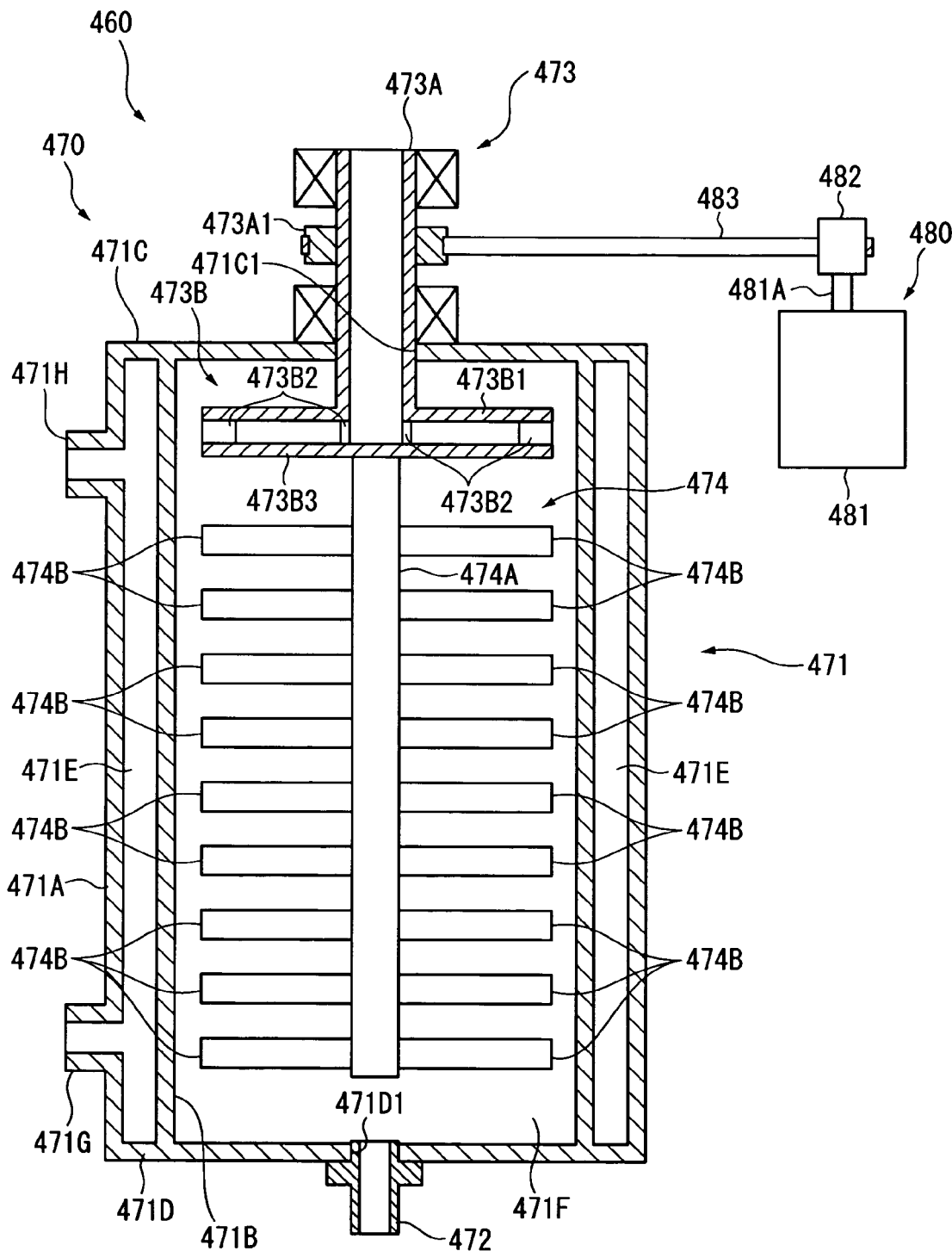
FIG. 5 is a schematic diagram showing an outline of a bead mill of the fourth embodiment.

FIG. 4 is a block diagram showing an outline of a polishing device 400 of the semiconductor wafer W of the fourth embodiment. FIG. 5 is a schematic diagram showing an outline of a bead mill.

As shown in FIG. 4, the polishing device 400 includes the stock solution feeder 310, the primary-polishing-prepared-solution feeder 220, the polishing section 130, a collecting section 440 and a slurry adjusting section 450.

The stock solution feeder 310 is connected to the primary-polishing-prepared-solution feeder 220 to feed a polishing-slurry stock solution stored in the internal space thereof to the primary-polishing-prepared-solution feeder 220.

The primary-polishing-prepared-solution feeder 220 is connected to the polishing section 130 and the collecting section 440. The primary-polishing-prepared-solution feeder 220 produces a primary-polishing-slurry prepared solution from the polishing-slurry stock solution fed from the stock solution feeder 310 to feed it to the polishing section 130, while feeding the polishing-slurry collected filtrate containing a lot of aggregated silica particles and dried silica particles fed from the collecting section 440 to the polishing section 130 as the primary-polishing-slurry prepared solution.

The primary-polishing-solution feeder provided to the primary polishing section 131 of the polishing section 130 is connected to the primary-polishing-prepared-solution feeder 220 so as to feed the primary-polishing-slurry prepared solution to the primary polishing pad.

The secondary-polishing-solution feeder provided to the secondary polishing section 132 of the polishing section 130 is connected to the slurry adjusting section 450 so as to feed the secondary-polishing-slurry adjusted solution that has been adjusted in the slurry adjusting section 450 to the secondary polishing pad.

The collecting section 440 processes the polishing-slurry collected solution used in the polishing section 130 so as to be reusable in the primary polishing section 131 and feeds the processed polishing-slurry collected solution to the primary-polishing-prepared-solution feeder 220 as the polishing-slurry collected filtrate. In addition, the collecting section 440 feeds the polishing-slurry collected solution to the slurry adjusting section 450. The collecting section 440 includes a collector 441 and the collecting filter 142.

The collector 441 is formed in, for instance, a substantially box-like shape and is connected to the collecting filter 142 and the slurry adjusting section 450.

The collector 441 stores the polishing-slurry collected solution and feeds it to the collecting filter 142 and the slurry adjusting section 450.

The slurry adjusting section 450 performs the slurry adjusting step for producing the secondary-polishing-slurry adjusted solution that has been adjusted so that the number of dried silica particles having the particle size of 1 μm or larger is 3000 pcs/ml or less. The slurry adjusting section 450 includes a pump 451, a bead mill 460, an adjusting filter 453 and the secondary-polishing-adjusted-solution feeder 353.

The pump 451 is connected to the collector 441 and the bead mill 460.

The pump 451 feeds the polishing-slurry collected solution stored in the collector 441 to the bead mill 460.

The bead mill 460 mills the aggregated silica particles and the dried silica particles contained in the polishing-slurry collected solution fed from the collector 441 via the pump 451 to produce the secondary-polishing-slurry adjusted solution that has been adjusted so that the number of dried silica particles having the particle size of 1 µm or larger is 3000 pcs/ml or less.

The bead mill 460 includes, as shown in FIG. 5, a bead mill body 470 and a driving section 480.

The bead mill body 470 is driven by the driving section 480 to produce the secondary-polishing-slurry adjusted solution. The bead mill body 470 includes a main body 471, a collected-solution inlet port 472, an adjusted-solution outlet port 473 and an agitator 474.

The main body 471 is formed in a substantially cylindrical shape with its top and bottom closed. Specifically, the main body 471 includes: a first cylindrical portion 471A having a substantially cylindrical shape; a second cylindrical portion 471B having a uniform height with the first cylindrical portion 471A and a diameter smaller than the first cylindrical portion 471A, the second cylindrical portion 471B provided on the inner side of the first cylindrical portion 471A with a predetermined space therebetween; an top surface 471C for covering an upper side of the first cylindrical portion 471A; and a bottom surface 471D for covering a lower side of the first cylindrical portion 471A.

The space between the first cylindrical portion 471A and the second cylindrical portion 471B defines a cooling-water circulating space 471E in which cooling water is circulated. The internal space of the second cylindrical portion 471B defines a milling space 471F filled with beads (not shown) for milling the dried silica particles and the like. Here, the beads are made of a zirconia and formed like grains having a diameter of 0.2 mm.

Provided on the bottom surface 471D side on a circumferential surface of the first cylindrical portion 471A is a substantially cylindrical cooling-water inlet port 471G that is adapted to introduce the cooling water into the cooling-water circulating space 471E from the outside. Provided on the top surface 471C side on the circumferential surface of the first cylindrical portion 471A is a substantially cylindrical cooling-water outlet port 471H that is adapted to discharge the cooling water introduced in the cooling-water circulating space 471E to the outside.

A substantially circular insertion hole 471C1 is formed substantially at the center of the top surface 471C.

A substantially circular fitting hole 471D1 is formed substantially at the center of the bottom surface 471D.

The collected-solution inlet port 472 is formed in a substantially cylindrical shape with an end being fitted with the fitting hole 471D1 of the bottom surface 471D and other end being connected to the pump 451.

The collected-solution inlet port 472 introduces the polishing-slurry collected solution fed via the pump 451 into the milling space 471F.

The adjusted-solution outlet port 473 discharges the polishing-slurry collected solution in which the dried silica particles and the like have been milled as the secondary-polishing-slurry adjusted solution. The adjusted-solution outlet port 473 includes a cylindrical outlet portion 473A and a centrifugal separator 473B.

The cylindrical outlet portion 473A is formed in a substantially cylindrical shape with an end being connected to the adjusting filter 453. The cylindrical outlet portion 473A is inserted in the insertion hole 471C1 of the top surface 471C with the other end thereof is positioned in the milling space 471F in a manner rotatable around an axis of the cylindrical outlet portion 473A. A substantially ringed mill belt receiver 473A1 is formed substantially at the center in an axial direction of a portion positioned on the outer side of the main body 471 of the cylindrical outlet portion 473A.

The centrifugal separator 473B separates the beads from the polishing-slurry collected solution in the milling space 471F and discharges the polishing-slurry collected solution as the secondary-polishing-slurry adjusted solution via the cylindrical outlet portion 473A. The centrifugal separator 473B includes a ringed plate 473B1, a plurality of blades 473B2 and a discoidal portion 473B3.

The ringed plate 473B1 is formed in a substantially ringed plate shape that extends outwardly from the other end of the cylindrical outlet portion 473A like a flange.

The blade 473B2 has a rectangular plate shape with the long side thereof being shorter than the thickness of the ringed plate 473B1. The blades 473B2 are attached on an outer circumferential end of the ringed plate 473B1 at a predetermined interval in a circumferential direction, the long sides of the blades 473B2 oriented substantially uniformly with a radial direction.

The discoidal portion 473B3 is formed in a substantially discoidal shape having a substantially uniform diameter with the outer diameter of the ringed plate 473B1, the discoidal portion 473B3 attached to the blade 473B2 so as to be substantially in parallel to the ringed plate 471B1.

The agitator 474 is provided in the milling space 471F and agitates the polishing-slurry collected solution in order to mill the dried silica particles and the like using the beads. The agitator 474 includes an agitation shaft 474A and a plurality of rotor pins 474B.

The agitation shaft 474A is formed in a substantially rod-like shape, which is fixed on the lower surface of the discoidal portion 473B3 of the centrifugal separator 473B in a manner extending downward substantially vertically.

The rotor pins 474B are formed in a substantially rod-like shape, which are attached in a manner extending radially from the circumferential surface of the agitation shaft 474A, the rotor pins 474B arranged in parallel to each other at a predetermined interval in the axial direction.

The driving section 480 drives the bead mill body 470. The driving section 480 includes a motor body 481 connected to a motor controller (not shown). Provided on a tip end of a rotary shaft 481A of the motor body 481 is a driving belt receiver 482 having a substantially cylindrical shape. A belt 483 is wound around the circumferential surface of the driving belt receiver 482 and the mill belt receiver 473A1 of the bead mill body 470.

The driving section 480 drives under the control of the motor controller the motor body 481 to rotate the adjusted-solution outlet port 473 and the agitator 474 via the belt 483. Specifically, the driving section 480 rotates the agitator 474 so that a milling energy becomes equal to or higher than 20 kWh/dry kg.

The adjusting filter 453 has performances similar to the second filter 253 of the polishing device 200 of the second embodiment, the adjusting filter 453 being connected to the secondary-polishing-adjusted-solution feeder 353.

The adjusting filter 453 filters the secondary-polishing-slurry adjusted solution discharged form the bead mill 460 to feed it to the secondary-polishing-adjusted-solution feeder 353.

[Operation of Semiconductor Wafer Polishing Device]

Now, as an operation of the polishing device 400 described above, polishing processing of the semiconductor wafer W will be described.

Incidentally, the primary polishing step, the secondary polishing step and the finish polishing step are the same as those in the above-described embodiments, only the slurry adjusting step will be described.

(Slurry Adjusting Step)

As the polishing processing of the semiconductor wafer W, the slurry adjusting step will be described below.

The polishing device 400 feeds the polishing-slurry collected solution stored in the collector 441 of the collecting section 440 to the bead mill 460 by the pump 451 of the slurry adjusting section 450. Here, as described above, the polishing-slurry collected solution contains a lot of aggregated silica particles and dried silica particles.

The bead mill 460 performs a milling step for milling the dried silica particles and the like contained in the fed polishing-slurry collected solution. To be more specific, the bead mill 460 introduces the polishing-slurry collected solution into the milling space 471F of the main body 471 via the collected-solution inlet port 472. Then, the driving section 480 rotates the adjusted-solution outlet port 473 and the agitator 474 in order to mill the dried silica particles and the like contained in the polishing-slurry collected solution using the beads filling up the milling space 471F. Thereafter, the centrifugal separator 473B of the rotating adjusted-solution outlet port 473 separates the beads from the polishing-slurry collected solution, and the polishing-slurry collected solution is discharged from the cylindrical outlet portion 473A as the secondary-polishing-slurry adjusted solution that has been adjusted so that the number of dried silica particles having the particle size of 1 µm or larger is 3000 pcs/ml or less.

The slurry adjusting section 450 feeds the secondary-polishing-slurry adjusted solution to the secondary-polishing-adjusted-solution feeder 353 via the adjusting filter 453. Then, the secondary-polishing-adjusted-solution feeder 353 feeds the secondary-polishing-slurry adjusted solution to the secondary polishing section 132.

[Advantages and Effects of Semiconductor Wafer Polishing Device]

According to the above-described fourth embodiment, the following advantages and effects can be attained in addition to (4) in the second embodiment.

(11) The slurry adjusting step includes the milling step for milling the dried silica particles and the like contained in the polishing-slurry collected solution using the bead mill 460.

Accordingly, by milling the dried silica particles contained in the polishing-slurry collected solution, the secondary-polishing-slurry adjusted solution that has been adjusted so that the number of dried silica particles having the particle size of 1 µm or larger is 3000 pcs/ml or less can be produced.

Since the bead mill 460 whose milling energy is the smallest is employed, hardness of the aggregated silica particles generated by the milling energy can be reduced as compared to an arrangement employing milling devices other than the bead mill 460, thereby realizing more proper polishing.

In addition, the used polishing-slurry collected solution can be reused in the secondary polishing step, so that usage amount of the polishing-slurry stock solution can be reduced.

(12) The lower limit of to-be-milled energy in the bead mill 460 is set to 20 kWh/dry kg or higher.

Since the lower limit of the to-be-milled energy is set to 20 kWh/dry kg, the content of the dried silica particles in the secondary-polishing slurry prepared solution can be effectively adjusted to 3000 pcs/ml or less.

[Modification]

Incidentally, the present invention is not limited to the above-described embodiments, but various improvements and modifications of designs can be applied thereto without deviating from the scope of the present invention.

In the first embodiment, in the ultrasonic irradiating stage, the ultrasonic wave may be irradiated to the finish-slurry stock solution with its temperature being 40° C. or higher.

In the filtering stage, the finishing-slurry stock solution may be filtered after a predetermined time period has passed after the ultrasonic irradiation. Here, with an arrangement in which the finishing-slurry stock solution is filtered in three hours after the ultrasonic irradiation, it can be filtered before the silica particles having been dispersed by the ultrasonic wave are re-aggregated due to the effect of the water-soluble-polymer agent as in the first embodiment, so that clogging of the finishing filter 154 can be prevented more securely. However the finishing-slurry stock solution may be filtered after a lapse of more than three hours after the ultrasonic irradiation.

As the ultrasonic irradiating section 152, a so-called ultrasonic cleaner may be employed.

There may also be employed an arrangement in which the number of dried silica particles contained in the finishing-slurry stock solution that has been filtered by the finishing filter 154 is counted by the liquid-borne particle counter, and the finishing-slurry stock solution is filtered again or fed to the finish polishing section 133 depending on the counting result.

In the second embodiment, a filter having a capturing efficiency different from those of the first filter 251 and the second filter 253 may be employed instead of the first filter 251 and the second filter 253.

In the third embodiment, the centrifugal force of the centrifugal separator 351 may be set to higher than 10000 G. With such arrangement, although the polishing rate is lowered, the minute defects generated in the secondary polishing step can be controlled to a predetermined number or less.

The slurry adjusting sections 250, 350, 450 may be combined arbitrarily.

The secondary-polishing-slurry adjusted solution produced in the slurry adjusting sections 250, 350, 450 may be fed to the primary polishing section 131. With such arrangement, although the machining allowance of the primary polishing step is larger than that of the secondary polishing step, the primary polishing can be performed without lowering the polishing rate by adjusting a polishing time and a load applied to the primary polishing pad.

Although the best arrangement for implementing the invention is disclosed above, the invention is not restricted thereto In other words, while the invention has been mainly illustrated and described on the specific exemplary embodiments, a person skilled in the art can modify the arrangements such as shape, material, quantity and the like of the above-described exemplary embodiments without departing from the technical idea and scope of the invention.

Therefore, the description limiting the shapes and the materials disclosed above is intended to be illustrative for easier understanding and not to limit the invention, hence the present invention includes the description using a name of component without a part of or all of the limitation on the shape and the material etc.

EXAMPLE

Next, the effects of the present invention will be described based on concrete examples.

First Example

First, the first example for explaining the effects of the first embodiment will be described.

Figure 6:
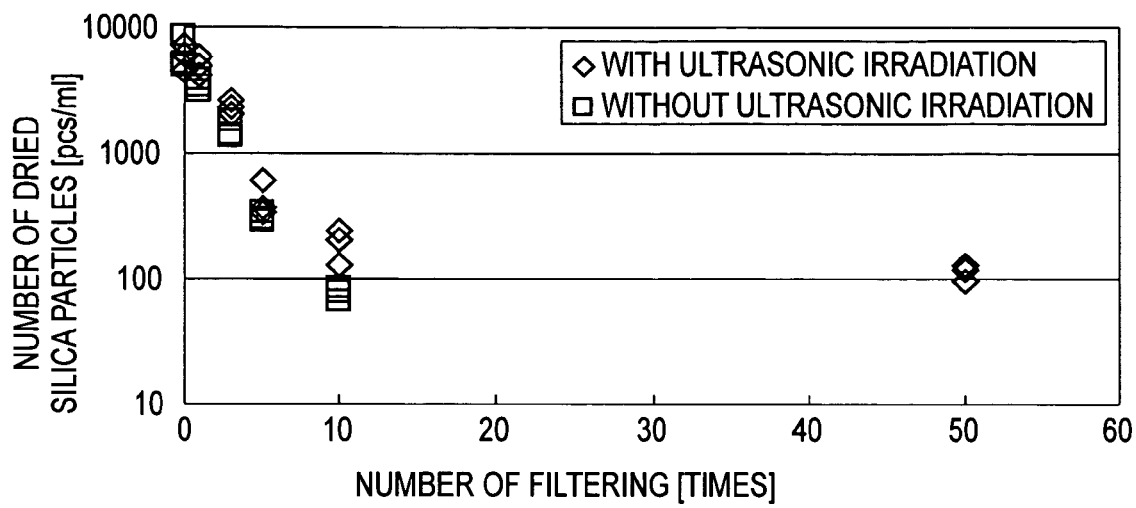
FIG. 6 is a graph showing how the number of filtering for a polishing-slurry finish solution with ultrasonic irradiation and the number of filtering for a polishing-slurry finish solution without the ultrasonic irradiation relate with the number of dried silica particles contained in these polishing-slurry finish solutions according to a first example of the present invention.
Figure 7:
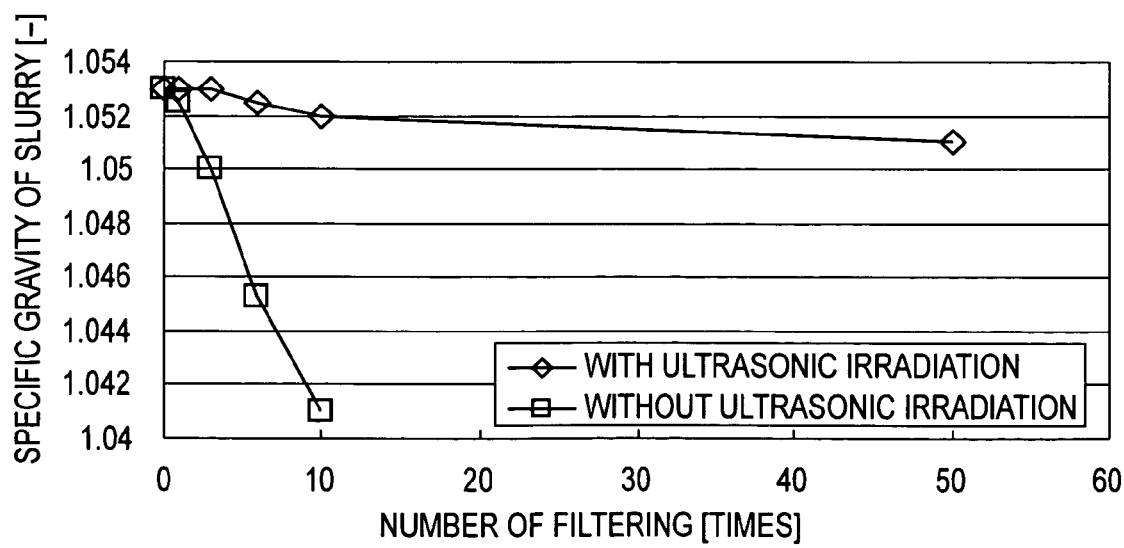
FIG. 7 is a graph showing how the number of filtering for the polishing-slurry finish solution with the ultrasonic irradiation and the number of filtering for the polishing-slurry finish solution without the ultrasonic irradiation relate with specific gravities of these polishing-slurry finish solutions according to the first example.
Figure 8:
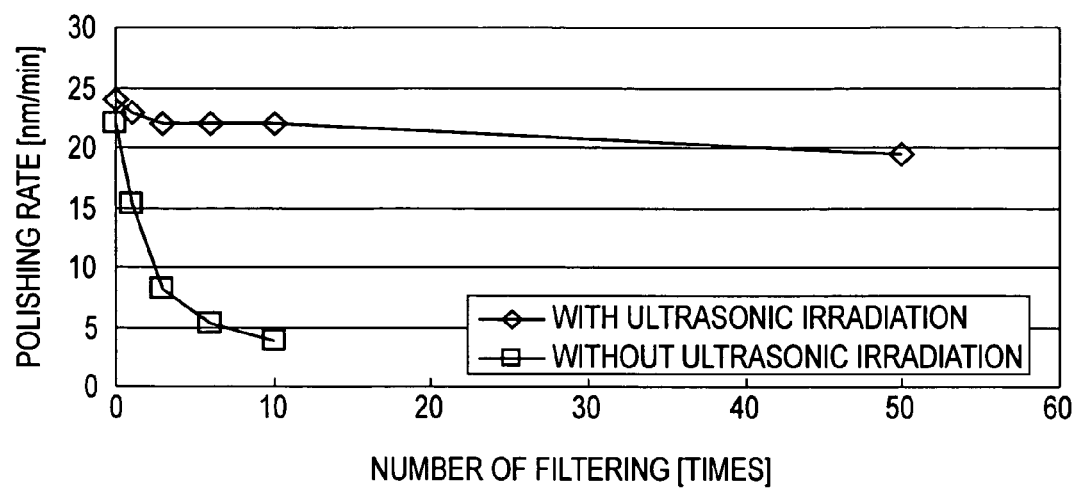
FIG. 8 is a graph showing how the number of filtering for the polishing-slurry finish solution with the ultrasonic irradiation and the number of filtering for the polishing-slurry finish solution without the ultrasonic irradiation relate with polishing rates in finish polishing using polishing-slurry finish solutions according to the first example.
Figure 9:
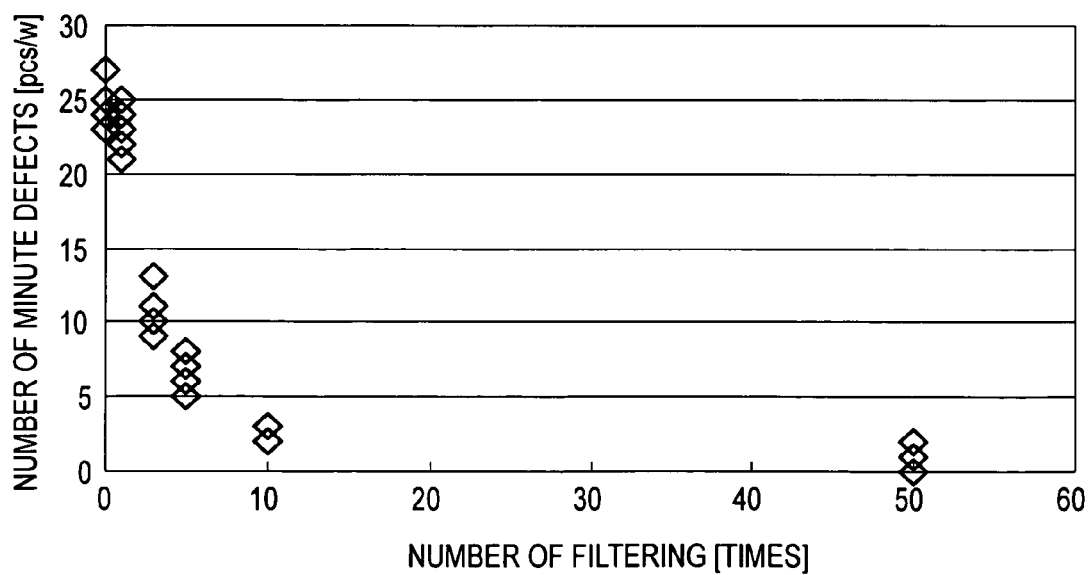
FIG. 9 is a graph showing how the number of filtering for the polishing-slurry finish solution with the ultrasonic irradiation relates with the number of minute defects generated in the finish polishing using this polishing-slurry finish solution according to the first example.

FIG. 6 is a graph showing how the number of filtering for a polishing-slurry finish solution with the ultrasonic irradiation and the number of filtering for a polishing-slurry finish solution without the ultrasonic irradiation relate with the number of dried silica particles contained in these polishing-slurry finish solutions. FIG. 7 is a graph showing how the number of filtering for the polishing-slurry finish solution with the ultrasonic irradiation and the number of filtering for the polishing-slurry finish solution without the ultrasonic irradiation relate with specific gravities of these polishing-slurry finish solutions. FIG. 8 is a graph showing how the number of filtering for the polishing-slurry finish solution with the ultrasonic irradiation and the number of filtering for the polishing-slurry finish solution without the ultrasonic irradiation relate with polishing rate in the finish polishing using these polishing-slurry finish solutions. FIG. 9 is a graph showing how the number of filtering for the polishing-slurry finish solution with the ultrasonic irradiation relates with the number of minute defects generated in the finish polishing using this polishing-slurry finish solution.

[Relations between Number of Filtering for Polishing Slurry Finish Solution with Ultrasonic Irradiation and Number of Filtering for Polishing Slurry Finish Solution without Ultrasonic Irradiation and Number of Dried Silica Particles Contained in These Polishing Slurry Finish Solutions]

First, how the number of filtering for a polishing-slurry finish solution with the ultrasonic irradiation and the number of filtering for a polishing-slurry finish solution without the ultrasonic irradiation relate with the number of dried silica particles contained in these polishing-slurry finish solutions will be described.

<Experiment Method>

After irradiating the ultrasonic wave (US) of 15 kHz to a finishing-slurry stock solution for a predetermined time period, the finishing-slurry stock solution was filtered a predetermined number of times using the finishing filter 154 to produce the polishing-slurry finish solution. Then, the number of dried silica particles having the particle size of 1 µm or larger contained per 1 ml was counted. Also, a polishing-slurry finish solution was produced from a finishing-slurry stock solution to which the ultrasonic wave was not irradiated, and the number of dried silica particles was countered similarly.

Specifically, a membrane filter (NucleporeTrack-Etch-Membrane manufactured by Whatman plc.) having a mesh size of 3 µm was set to a lower side of a holder (Swin-Lok Holder 25 mm manufactured by Whatman plc.), and each of the polishing-slurry finish solutions was injected into the holder by 1 ml to 5 ml using an injector. Then, water of 20 ml was injected into the holder to clean the membrane filter, which was performed three times. The cleaned membrane filter was observed by SEM (Scanning Electron Microscope) to count the number of dried silica particles having the particle size of 1 µm or larger. Then, using a liquid-borne particle counter (KS71 manufactured by Rion Co., Ltd.), the number of dried silica particles having the particle size of 1 µm or larger contained in each of the polishing-slurry finish solutions was counted.

<Experiment Result>

As shown in FIG. 6, it was observed that, in the polishing-slurry finish solution with the ultrasonic irradiation, the number of dried silica particles decreased as the number of filtering times increased up to ten. When the number of filtering times exceeded ten, the number of dried silica particles did not reduce so much even when the number of filtering increased further. Especially, it was observed that the number of dried silica particles was reduced to 1000 pcs. or less by performing the filtering four times.

In addition, since the silica particles with large particle sizes generated by aggregation due to the effect of the water-soluble-polymer agent were dispersed by the ultrasonic irradiation, the size of the silica particles to be captured was reduced, and thus filtering was performed without occurrence of clogging in the finishing filter 154 even when the number of filtering times reached fifty.

On the other hand, in the polishing-slurry finish solution without the ultrasonic irradiation, the number of dried silica particles was observed to decrease as the number of filtering times increased up to ten.

Also, since the ultrasonic wave was not irradiated, the silica particles with large particle sizes generated by aggregation due to the effect of the water-soluble-polymer agent were captured, clogging occurred in the finishing filter 154 when the number of filtering reached ten and no more filtering could be performed.

[Relations between Number of Filtering for Polishing-Slurry Finish Solution with Ultrasonic Irradiation and Number of Filtering for Polishing-Slurry Finish Solution without Ultrasonic Irradiation and Specific Gravities of These Polishing-Slurry Finish Solutions]

Next, how the number of filtering for the polishing-slurry finish solution with the ultrasonic irradiation and the number of filtering for the polishing-slurry finish solution without the ultrasonic irradiation relate with specific gravities of these polishing-slurry finish solutions will be described.

<Experiment Method>

After irradiating the ultrasonic wave of 15 kHz to the finishing-slurry stock solution for a predetermined time period, the finishing-slurry stock solution was filtered by a predetermined number of times using the finishing filter 154 to produce the polishing-slurry finish solution. Then, specific gravities after each filtering were compared. Also, the polishing-slurry finish solution was produced from the finishing-slurry stock solution to which the ultrasonic wave was not irradiated, and specific gravities after each filtering were compared similarly.

<Experiment Result>

As shown in FIG. 7, with the polishing-slurry finish solution with the ultrasonic irradiation, since the size of the silica particles to be captured was reduced by the ultrasonic irradiation as described above, reduction rate in specific gravity relative to the number of filtering was observed to be small.

On the other hand, with the polishing-slurry finish solution without the ultrasonic irradiation, since the silica particles with large sizes were captured, reduction rate in specific gravity relative to the number of filtering was observed to be larger as compared to that of the polishing-slurry finish solution with the ultrasonic irradiation.

[Relation between Number of Filtering for Polishing-Slurry Finish Solution with Ultrasonic Irradiation and Number of Filtering for Polishing-Slurry Finish Solution without Ultrasonic Irradiation and Polishing Rates in Finish Polishing Using These Polishing-Slurry Finish Solutions]

Next, how the number of filtering for the polishing-slurry finish solution with the ultrasonic irradiation and the number of filtering for the polishing-slurry finish solution without the ultrasonic irradiation relate with polishing rates in finish polishing using these polishing-slurry finish solutions will be described.

<Experiment Method>

After irradiating the ultrasonic wave of 15 kHz to the finishing-slurry stock solution for a predetermined time period, the finishing-slurry stock solution was filtered by a predetermined number of times using the finishing filter 154 to produce the polishing-slurry finish solution. Then, the finish polishing of the semiconductor wafers W was performed using the polishing-slurry finish solution after each filtering and polishing rates were compared. Also, a polishing-slurry finish solution was produced from the finishing-slurry stock solution to which the ultrasonic wave was not irradiated, and the polishing rate after each filtering were compared similarly.

<Experiment Result>

As shown in FIG. 8, with the polishing-slurry finish solution with the ultrasonic irradiation, since the reduction rate in specific gravity relative to the number of filtering was small as described above, reduction rate in the polishing rate relative to the number of filtering was observed to be small.

On the other hand, with the polishing-slurry finish solution without the ultrasonic irradiation, since the reduction rate in specific gravity relative to the number of filtering was large as described above, reduction rate of the polishing rate relative to the number of filtering was observed to be larger as compared to that of the polishing-slurry finish solution with the ultrasonic irradiation.

[Relation between Number of Filtering for Polishing-Slurry Finish Solution with Ultrasonic Irradiation and Number of Minute Defects Generated in Finish Polishing Using This Polishing-Slurry Finish Solution]

Next, how the number of filtering of the polishing-slurry finish solution with the ultrasonic irradiation relates with the number of minute defects generated in finish polishing using the polishing-slurry finish solution will be described.

<Experiment Method>

After irradiating the ultrasonic wave of 15 kHz to the finishing-slurry stock solution for a predetermined time period, the finishing-slurry stock solution was filtered by a predetermined number of times using the finishing filter 154 to produce the polishing-slurry finish solution. Then, the finish polishing of the semiconductor wafers W was performed using the polishing-slurry finish solution after each filtering and the numbers of minute defects per semiconductor wafer W were compared.

<Experiment Result>

As shown in FIG. 9, the number of minute defects per semiconductor wafer W was observed to decrease as the number of filtering increased up to ten. Also, once the number of filtering times exceeded ten, it was observed that the number of minute defects did not reduce so much even if the number of filtering increased further. Especially, it was observed that the number of minute defects was reduced to 10 pcs. or less by performing the filtering four times.

[Evaluation]

From the test results above, it was verified that the arrangement of the first embodiment including the ultrasonic irradiation of 15 kHz and the filtering of up to ten times had effects as follows: preventing clogging of the filter; selectively removing the dried silica particles from the polishing-slurry finish solution; and reducing the number of minute defects without lowering the polishing rate.

Second Example

Next, the second example for explaining the effects of the second embodiment will be described.

Incidentally, a projected defect that is larger than the minute defect will be hereinafter referred to as a scratch defect.

Figure 10:
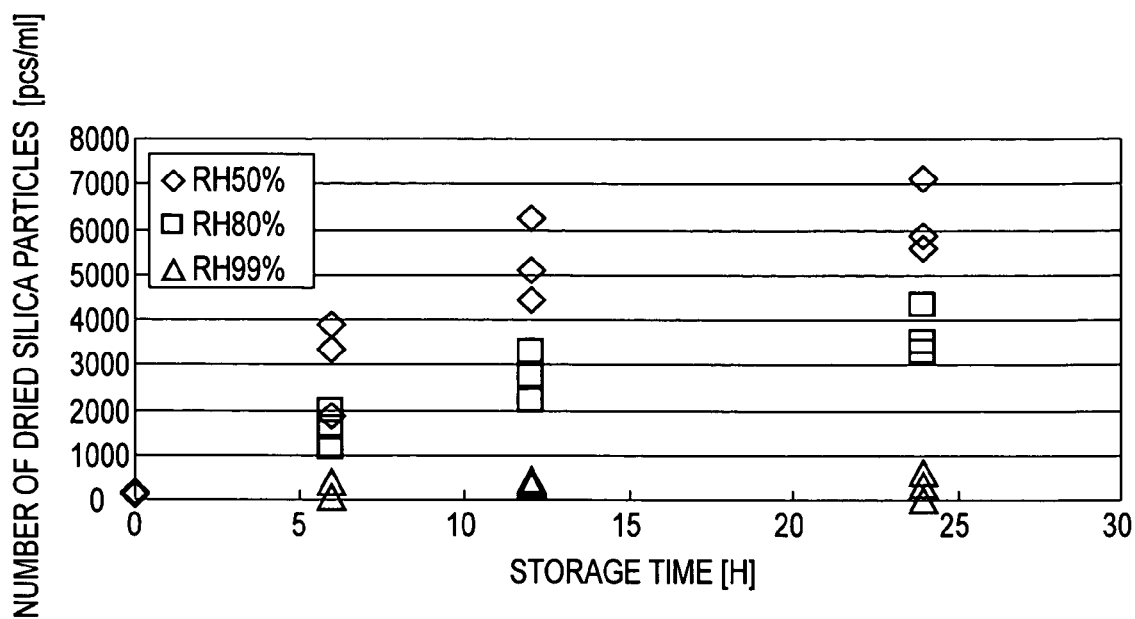
FIG. 10 is a graph showing how storage times of polishing-slurry stock solutions stored under various humidity relate with the number of dried silica particles contained in each of the finishing-slurry stock solutions according to a second example of the present invention.
Figure 11:
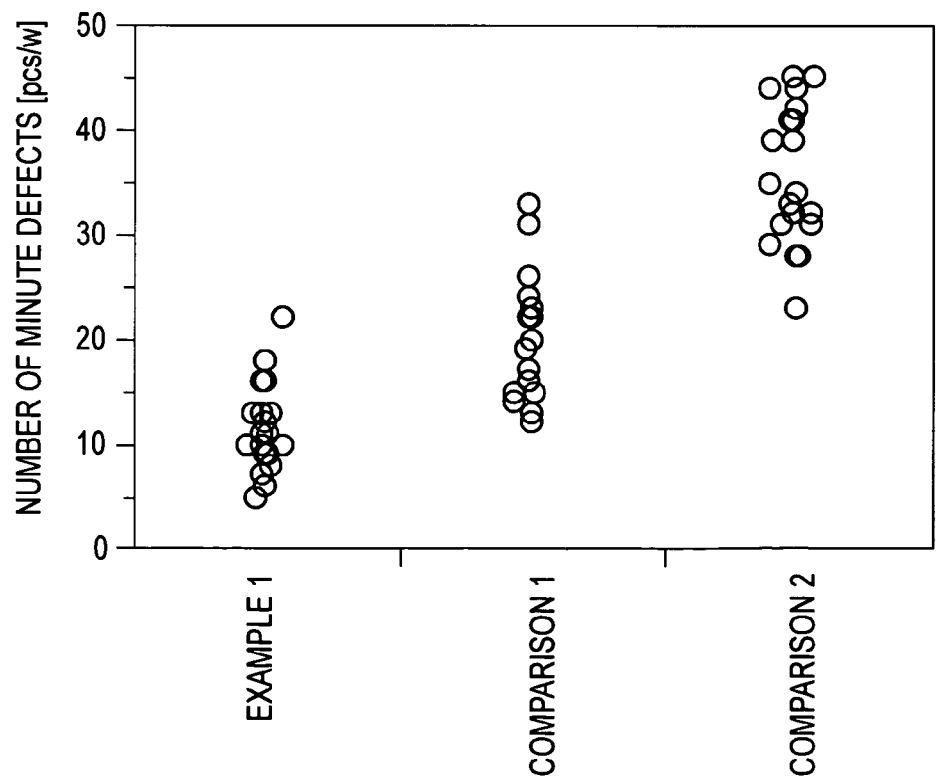
FIG. 11 is a graph showing the number of minute defects generated in secondary polishing using each of polishing slurry solutions of Example 1, Comparison 1 and Comparison 2 according to the second example.
Figure 12:
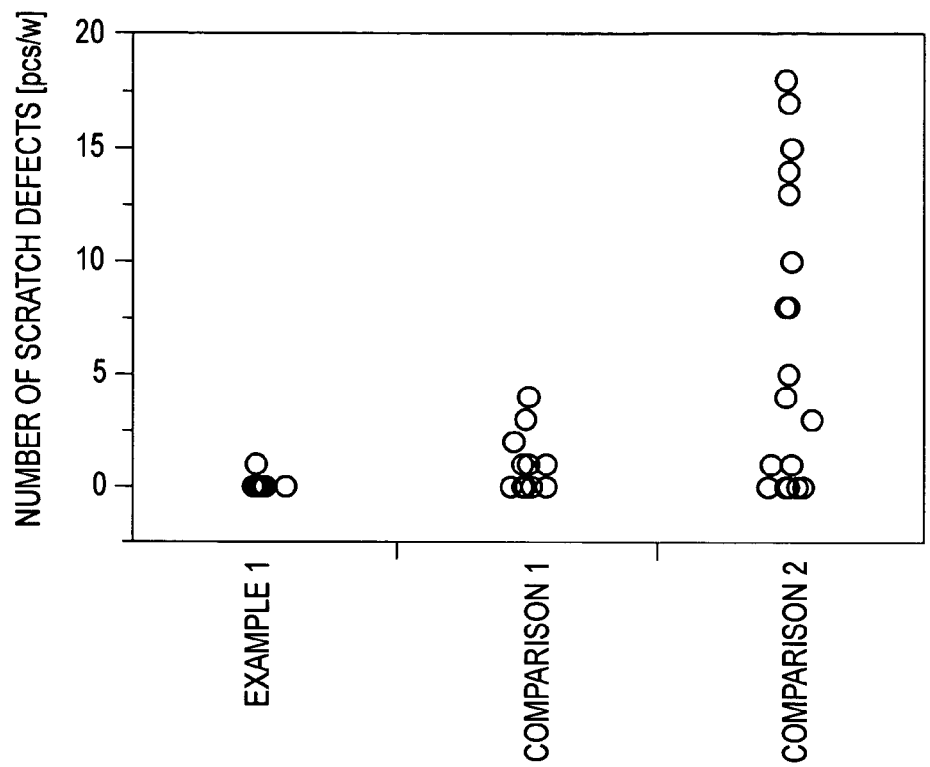
FIG. 12 is a graph showing the number of scratch defects generated in the secondary polishing using each of the polishing slurry solutions of Example 1, Comparison 1 and Comparison 2 according to the second example.

FIG. 10 is a graph showing how storage periods of time of stock-polishing-slurry solutions stored under various humidity relate with the number of dried silica particles contained in these stock-polishing slurry solutions. FIG. 11 is a graph showing the number of minute defects generated in each of the secondary polishing using polishing slurry solutions of Example 1, Comparison 1 and Comparison 2. FIG. 12 is a graph showing the number of scratch defects generated in each of the secondary polishing using polishing slurry solutions of Example 1, Comparison 1 and Comparison 2.

[Relation between Storage Times of Polishing-Slurry Stock Solutions Stored under Various Humidity and Number of Dried Silica Particles Contained in These Stock-Polishing Slurry Solutions]

First, how storage times of stock-polishing-slurry solutions stored under various humidity relate with the number of dried silica particles contained in each of the stock-polishing slurry solutions will be described.

<Experiment Method>

The polishing-slurry stock solutions were stored in storing chambers made of PFA (hereinafter, referred to as PFA storing chambers), each of which was set to have humidity of 50%, 80% and 99%, for 0, 6, 12 and 24 hours. Then, the number of dried silica particles having the particle sizes of 1 μm or larger contained per 1 ml was counted as follows.

Specifically, a membrane filter (NucleporeTrack-Etch-Membrane manufactured by Whatman plc.) having a mesh size of 3 μm was set to a lower side of a holder (Swin-Lok Holder 25 mm manufactured by Whatman plc.), and each of the polishing-slurry stock solutions was injected into the holder by 1 ml to 5 ml using an injector. Then, water of 20 ml was injected into the holder to clean the membrane filter, which was performed three times. The cleaned membrane filter was observed by SEM (Scanning Electron Microscope) to count the number of dried silica particles having the particle sizes of 1 μm or larger.

<Experiment Result>

As shown in FIG. 10, the number of dried silica particles contained per 1 ml was observed to become larger for the polishing-slurry stock solution stored under lower humidity and for longer storage time.

Especially, it was observed that, when the polishing-slurry stock solution was stored in 99% humidity atmosphere, the number of dried silica particles having the particle sizes of 1 μm or larger contained per 1 ml was less than 1000 pcs even after 24 hours.

[Numbers of Minute Defects and Scratch Defects Generated in Secondary Polishing Using Each Polishing Slurry Solution]

Next, the numbers of minute defects and scratch defects generated in each of the secondary polishing using polishing slurry solutions of Example 1, Comparison 1 and Comparison 2 will be described.

Example 1

The polishing slurry solution of Example 1 was produced by processing the polishing-slurry stock solution with the slurry adjusting section 250 of the second embodiment. The number of dried silica particles having the particle size of 1 μm or larger contained in the polishing slurry solution of Example 1 was 1700 pcs/ml.

<Comparison 1>

The polishing slurry solution of Comparison 1 was produced by adding purified water to a polishing-slurry stock solution stored in the PFA storing chamber of 99% humidity for 24 hours. The number of dried silica particles having the particle size of 1 μm or larger contained in the polishing slurry solution of Comparison 1 was 2600 pcs/ml.

<Comparison 2>

The polishing slurry solution of Comparison 2 was produced by adding purified water to polishing-slurry stock solution stored in the PFA storing chamber of 75% humidity for 24 hours. The number of dried silica particles having the particle sizes of 1 μm or larger contained in the polishing slurry solution of Comparison 2 was 5400 pcs/ml.

<Experiment Method>

The secondary polishing was performed on semiconductor wafers W using the polishing slurry solutions of Example 1, Comparison 1 and Comparison 2 under a polishing condition same as the secondary polishing step in the secondary polishing section 132. The numbers of minute defects and scratch defects per semiconductor wafer W were compared.

<Experiment Result>

As shown in FIG. 11, the polishing slurry solution of Example 1 showed the smallest number of minute defects per semiconductor wafer W, while the polishing slurry solution of Comparison 2 showed the largest number of minute defects. Accordingly, it was verified that, the number of minute defects generated per semiconductor wafer W in the secondary polishing became smaller as the number of dried silica particles having the particle sizes of 1 μm or larger contained in the polishing slurry solution decreased.

As shown in FIG. 12, the polishing slurry solution of Example 1 also showed the smallest number of scratch defects per semiconductor wafer W, while the polishing slurry solution of Comparison 2 showed the largest number of scratch defects.

[Evaluation]

From the result above, the secondary-polishing-slurry adjusted solution produced by the arrangement of second embodiment, i.e., the secondary-polishing-slurry adjusted solution produced by processing the polishing-slurry stock solution that has been stored under the condition of 99% humidity with the slurry adjusting section 250, was verified to be particularly effective in reducing the number of minute defects.

Third Example

Next, a third example for explaining the effects of the third embodiment will be described.

Figure 13:
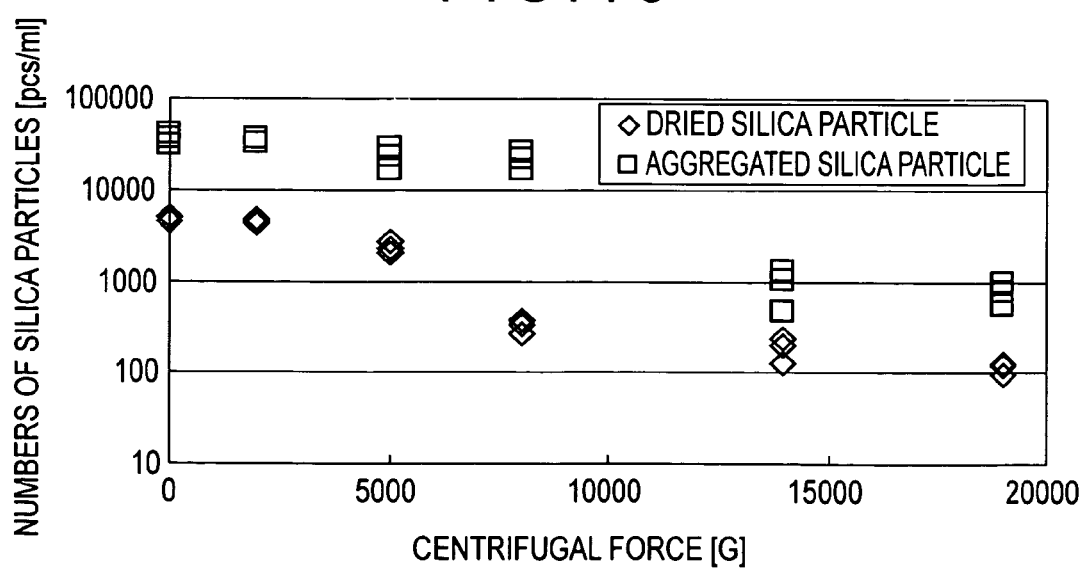
FIG. 13 is a graph showing how centrifugal force at the time of centrifugalizing a polishing-slurry collected filtrate relates with the numbers of dried silica particles and aggregated silica particles contained in this polishing-slurry collected filtrate according to the third example of the present invention.
Figure 14:
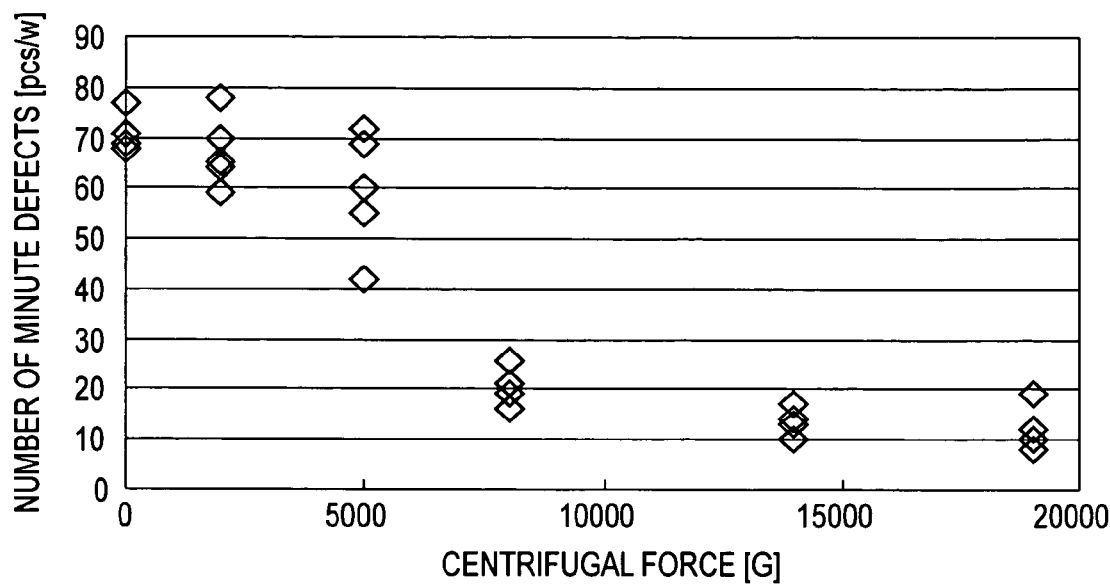
FIG. 14 is a graph showing how the centrifugal force at the time of centrifugalizing the polishing-slurry collected filtrate relates with the number of minute defects generated in secondary polishing using this polishing-slurry collected filtrate according to the third example.
Figure 15:
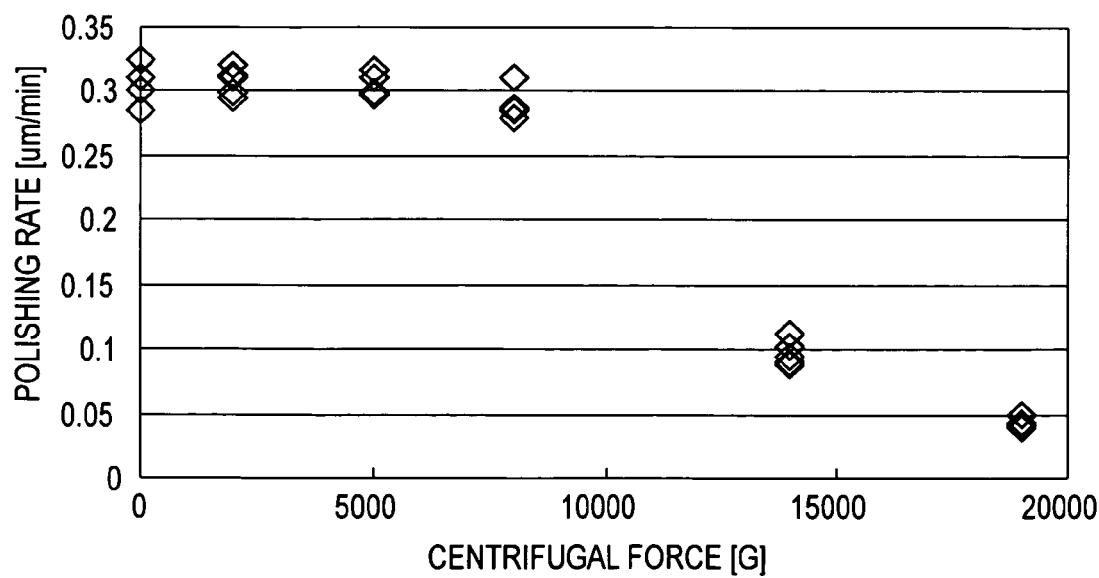
FIG. 15 is a graph showing how the centrifugal force at the time of centrifugalizing the polishing-slurry collected filtrate relates with a polishing rate in the secondary polishing using this polishing-slurry collected filtrate according to the third example.

FIG. 13 is a graph showing how centrifugal force at the time of centrifugalizing a polishing-slurry collected filtrate relates with the number of dried silica particles contained in this polishing-slurry collected filtrate. FIG. 14 is a graph showing how the centrifugal force at the time of centrifugalizing the polishing-slurry collected filtrate relates with the number of minute defects generated in the secondary polishing using this polishing-slurry collected filtrate. FIG. 15 is a graph showing how the centrifugal force at the time of centrifugalizing the polishing-slurry collected filtrate relates with the polishing rate in the secondary polishing using this polishing-slurry collected filtrate.

[Relation between Centrifugal Force for Centrifugalizing Polishing-Slurry Collected Filtrate and Numbers of Dried Silica Particles and Aggregated Silica Particles Contained in This Polishing-Slurry Collected Filtrate]

First, how a centrifugal force at the time of centrifugalizing the polishing-slurry collected filtrate relate with the numbers of dried silica particles and aggregated silica particles contained in this polishing-slurry collected filtrate will be described.

<Experiment Method>

Polishing-slurry collected filtrates processed in the collecting section 140 were centrifugalized by different centrifugal forces for a centrifugal time of 3 min/L. Then, the numbers of dried silica particles and aggregated silica particles having the particle size of 1 μm or larger contained in the centrifugalized polishing-slurry collected filtrates were countered by the above-described method using the SEM and the liquid particle counter (KS71 manufactured by Rion Co., Ltd.).

<Experiment Result>

As shown in FIG. 13, the numbers of dried silica particles and aggregated silica particles having the particle size of 1 μm or larger was verified to decrease as the centrifugal force increased.

Especially, it was verified that more dried silica particles could be removed as compared to the aggregated silica particles when the centrifugal force was in the range from 5000 G to 10000 G. Also, when the centrifugal force was 5000 G or less, it was verified to be difficult to adjust the number of dried silica particles having the particle size of 1 μm or larger to 3000 pcs/ml or less.

[Relation between Centrifugal Force for Centrifugalizing Polishing-Slurry Collected Filtrate and Number of Minute Defects Generated in Secondary Polishing Using This Polishing-Slurry Collected Filtrate]

Next, how a centrifugal force at the time of centrifugalizing the polishing-slurry collected filtrate relates with the number of minute defects generated in the secondary polishing using this polishing-slurry collected filtrate will be described.

<Experiment Method>

Using the polishing-slurry collected filtrates that have been centrifugalized by different centrifugal forces for a centrifugal time of 3 min/L, the secondary polishing was performed on semiconductor wafers W. The numbers of minute defects generated per semiconductor wafer W were compared.

<Experiment Result>

As shown in FIG. 14, the number of minute defects generated per semiconductor wafer W was verified to decrease as the centrifugal force increased.

Especially, the number of minute defects was verified to be very small when the centrifugal force was 50000 G or higher

[Relation between Centrifugal Force for Centrifugalizing Polishing-Slurry Collected Filtrate and Polishing Rate in Secondary Polishing Using This Polishing-Slurry Collected Filtrate]

Next, how a centrifugal force at the time of centrifugalizing the polishing-slurry collected filtrate relates with the polishing rate in the secondary polishing using this polishing-slurry collected filtrate will be described.

<Experiment Method>

Using the polishing-slurry collected filtrates that have been centrifugalized by different centrifugal forces for a centrifugal time of 3 min/L, the secondary polishing was performed on semiconductor wafers W. The polishing rates were compared.

<Experiment Result>

As shown in FIG. 15, it was verified the polishing rates were almost the same in the centrifugal force range from 0 G to 8000 G. It was also verified that, when the centrifugal force reached 8000 G, the polishing rates were lowered as the centrifugal force increased.

Especially, in the centrifugal force range of 8000 G to 14000 G, it was verified that the polishing rate was lowered drastically, while the number of minute defects became very small.

[Evaluation]

From the results above, the arrangement of the third embodiment for performing centrifugalizing by the centrifugal force of 5000 G to 10000 G was verified to be appropriate in terms of the number of minute defects and the polishing rate. Especially, the centrifugal force of 8000 G was verified to be most appropriate because the dried silica particles could be selectively removed and the number of minute defects could be reduced without lowering the polishing rate.

Fourth Example

Next, a fourth example for explaining the effects of the fourth embodiment will be described.

Figure 16:
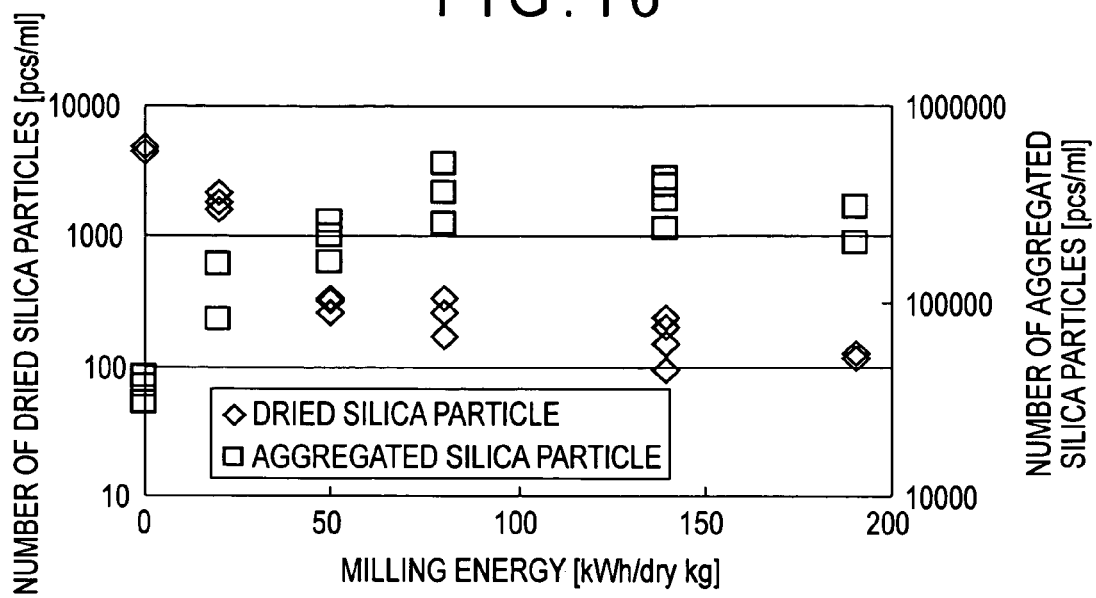
FIG. 16 is a graph showing how a milling energy at the time of milling a polishing-slurry collected solution relates with the numbers of dried silica particles and aggregated silica particles contained in the polishing-slurry collected solution according to a fourth example of the present invention.
Figure 17:
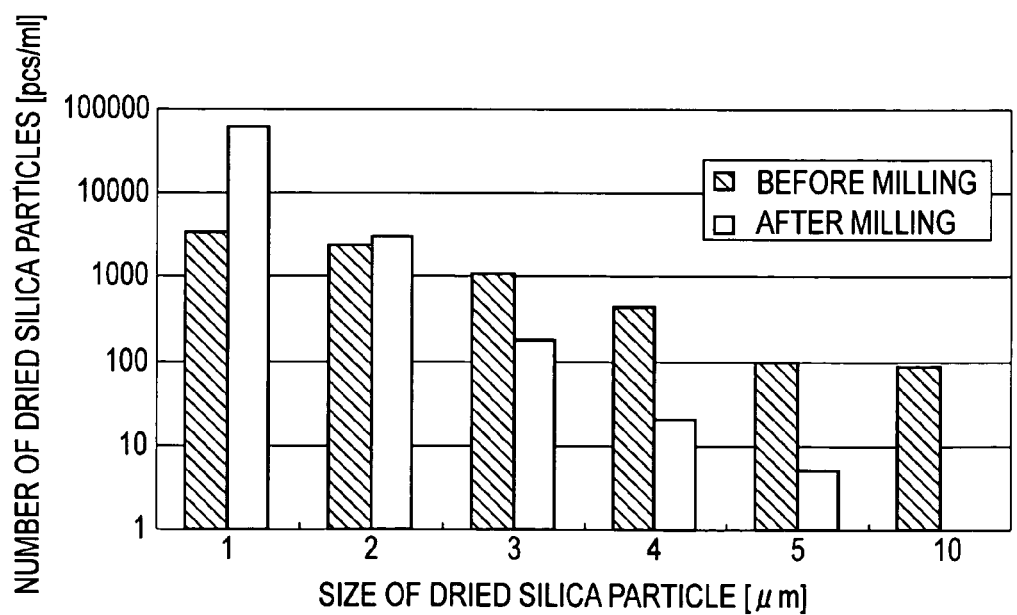
FIG. 17 is a graph showing how the size and the number of dried silica particles contained in the polishing-slurry collected solution before milling relate with those of after milling according to the fourth example.
Figure 18:
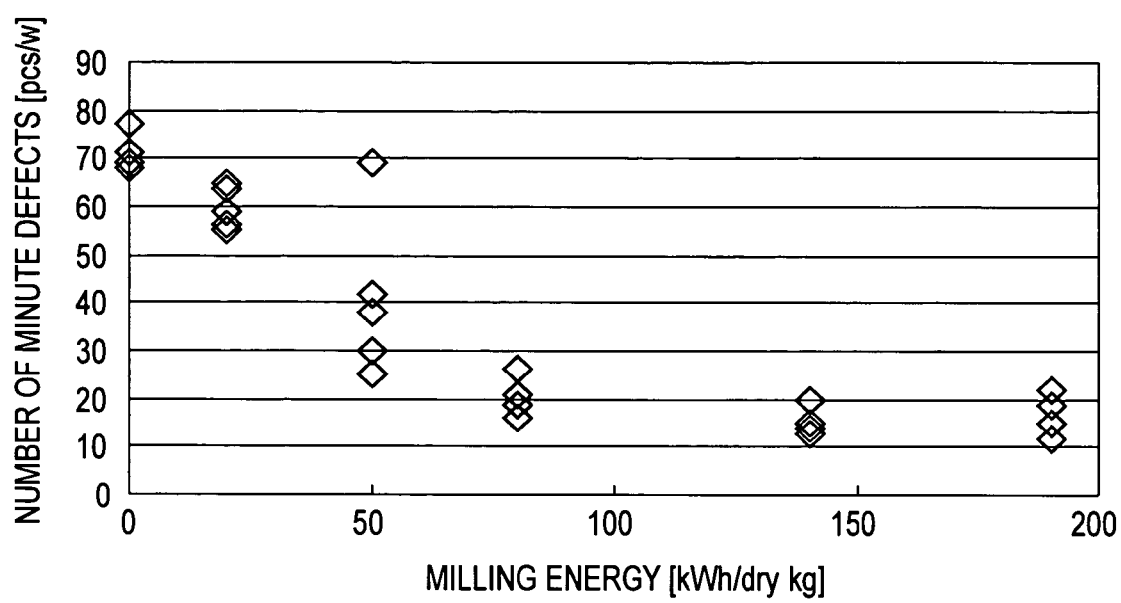
FIG. 18 is a graph showing how the milling energy at the time of milling the polishing-slurry collected solution relates with the number of minute defects generated in secondary polishing using this polishing-slurry collected solution according to the fourth example.

FIG. 16 is a graph showing how a milling energy at the time of milling a polishing-slurry collected solution relates with the numbers of dried silica particles and aggregated silica particles contained in this polishing-slurry collected solution. FIG. 17 is a graph showing how the size and the number of dried silica particles contained in the polishing-slurry collected solution before milling relates with those of after milling. FIG. 18 is a graph showing how the milling energy at the time of milling the polishing-slurry collected solution relates with the number of minute defects generated in the secondary polishing using this polishing-slurry collected solution.

[Relation between Milling Energy for Milling Polishing-Slurry Collected Solution and Numbers of Dried Silica Particles and Aggregated Silica Particles Contained in This Polishing-Slurry Collected Solution]

First, how a milling energy at the time of centrifugalizing the polishing-slurry collected solution relates with the numbers of dried silica particles and aggregated silica particles contained in this polishing-slurry collected solution will be described.

<Experiment Method>

The polishing-slurry collected solutions collected by the collecting section 140 were milled by different milling energies for a milling time of 3 min/L using a bead mill having a capacity of 30 L and filled with beads, each of the beads made of zirconia and having a diameter of 2 mm (hereinafter, referred to as an Example bead mill). Then, the numbers of dried silica particles and aggregated silica particles having the particle size of 5 μm or larger contained in the milled polishing-slurry collected solutions were countered by the above-described method using the SEM and the liquid particle counter.

<Experiment Result>

As shown in FIG. 16, since the dried silica particles of the number corresponding to intensity of the energy were milled by the beads, the number of dried silica particles having the particle size of 5 μm or larger was verified to decrease as the milling energy increased In other words, it was verified that the number of dried silica particles having a particle size of below 5 μm increased as the milling energy increased.

On the other hand, it was verified that, since aggregation of the silica particles was accelerated due to the milling energy, the number of aggregated silica particles having the particle size of 5 μm or larger increased as the milling energy increased.

[Relation between Size and Number of Dried Silica Particles Contained in Polishing-Slurry Collected Solution before Milling and Those of after Milling]

Next, how the size and the number of dried silica particles contained in the polishing-slurry collected solution before milling relates with those after milling will be described.

<Experiment Method>

The numbers of dried silica particles of different sizes contained in the polishing-slurry collected solution before the milling and after the milling using the Example bead mill were counted by the above-described method using the SEM and the liquid particle counter. Here, the milling was performed under the condition as follows: the milling energy of 80 kWh/dry kg; and the milling time of 3 min/L.

<Experiment Result>

As shown in FIG. 17, the number of dried silica particles having the particle size of 3 μm or larger contained in the polishing-slurry collected solution after milling was verified to be smaller as compared to that before milling. Also, the number of dried silica particles having particle sizes of 1 μm and 2 μm was verified to be larger after milling as compared to those before milling because the dried silica particles having the particle sizes of 3 μm or larger were milled during the milling.

[Relation between Milling Energy for Milling Polishing-Slurry Collected Solution and Number of Minute Defects Generated in Secondary Polishing Using This Polishing-Slurry Collected Solution]

Next, how milling energy at the time of milling the polishing-slurry collected solution relates with the number of minute defects generated in the secondary polishing using this polishing-slurry collected solution will be described.

<Experiment Method>

Using the polishing-slurry collected solutions that have been milled by different milling energies for a centrifugal time of 3 min/L by the Example bead mill, the secondary polishing was performed on semiconductor wafers W. The numbers of minute defects generated per semiconductor wafer W were compared.

<Experiment Result>

As shown in FIG. 18, the number of minute defects generated per semiconductor wafer W was verified to decrease as the milling energy increased.

[Evaluation]

From the result above, it was verified that the arrangement of the fourth embodiment for performing milling at the milling energy of 20 kWh/dry kg or higher was effective in reducing the number of minute defects.

The priority application Numbers JP2005-60 258134, JP2005-60 258150 upon which this patent application is based is hereby incorporated by reference.

What is claimed is:

1. A polishing method for a semiconductor wafer, comprising:
a slurry adjusting step for adjusting a polishing slurry containing silica particles so that the number of silica particles having a composition ratio of Si/O of 50–60 wt %/40–50 wt %, a modulus of elasticity of $1.4 \times 10^{10}$ Pa or higher and a particle size of 1 μm or larger is 3000 pcs/ml or less, wherein the semiconductor wafer is polished using the polishing slurry adjusted in the slurry adjusting step.

2. The polishing method according to claim 1, wherein polishing of the semiconductor wafer includes two steps of a rough polishing step and a finish polishing step, and the polishing slurry adjusted in the slurry adjusting step is used in the rough polishing step.

3. The polishing method according to claim 2, wherein the slurry adjusting step includes:

a stock-solution filtering step for filtering a stock solution of the polishing slurry with a first filter adapted to capture a solid matter having a predetermined size;

a slurry producing step for producing the polishing slurry by compounding the stock solution of the polishing slurry filtered in the stock-solution filtering step and an additive; and a prepared-solution filtering step for filtering the polishing slurry produced in the slurry producing step with a second filter adapted to capture a solid matter having a size smaller than that captured by the first filter.

4. The polishing method according to claim 3, wherein a capturing efficiency of the first filter for capturing a solid matter having a size equal to or more than fifty times as large as a primary particle of silica contained in the stock solution of the polishing slurry is 99.99% or higher, and a capturing efficiency of the second filter for capturing a solid matter having a size equal to or more than ten times as large as the primary particle is 99.99% or higher.

5. The polishing method according to claim 2, wherein the slurry adjusting step further includes a centrifugalizing step for centrifugalizing the polishing slurry.

6. The polishing method according to claim 5, wherein a centrifugal force for the centrifugalizing in the centrifugalizing step is in the range from 5000 G to 10000 G.

7. The polishing method according to claim 2, wherein the slurry adjusting step further includes a milling step for milling the silica particles contained in the polishing slurry with a bead mill.

8. The polishing method according to claim 7, wherein an energy per unit mass applied to an object to be milled in the milling step is 20 kWh/dry kg or higher.

9. The polishing method according to claim 1, wherein polishing of the semiconductor wafer includes two steps of a rough polishing step and a finish polishing step, the slurry adjusting step further includes a ultrasonic irradiating stage for irradiating an ultrasonic wave to the polishing slurry and a filtering stage for filtering with a filter the polishing slurry to which the ultrasonic wave is irradiated in the ultrasonic irradiating stage, the polishing slurry being adjusted so that the number of silica particles having a composition ratio of Si/O of 50–60 wt %/40–50 wt %, a modulus of elasticity of $1.4 \times 10^{10}$ Pa or higher and a particle size of 1 μm or larger is 1000 pcs/ml or less, and the polishing slurry adjusted in the slurry adjusting step is used in the finish polishing step.

10. The polishing method according to claim 9, wherein in the ultrasonic irradiating stage, the ultrasonic wave is irradiated to the polishing slurry with a temperature of the polishing slurry maintained to be 40° C. or lower.

11. The polishing method according to claim 9, wherein in the filtering stage, the polishing slurry is filtered within three hours after the ultrasonic wave is irradiated to the polishing slurry in the ultrasonic irradiating stage.

12. A polishing method for a semiconductor wafer for polishing the semiconductor wafer through two steps including a rough polishing step and a finish polishing step using a polishing slurry containing silica particles, the method including:

a first slurry adjusting step for adjusting the polishing slurry so that the number of silica particles having a composition ratio of Si/O of 50–60 wt %/40–50 wt %, a modulus of elasticity of $1.4 \times 10^{10}$ Pa or higher and a particle size of 1 μm or larger is 3000 pcs/ml or less; and a second slurry-adjusting step including a ultrasonic irradiating stage for irradiating an ultrasonic wave to the polishing slurry and a filtering stage for filtering with a filter the polishing slurry to which the ultrasonic wave is irradiated in the ultrasonic irradiating stage, the polishing slurry being adjusted so that the number of silica particles having a composition ratio of Si/O of 50–60 wt %/40–50 wt %; a modulus of elasticity of $1.4 \times 10^{10}$ Pa or higher and a particle size of 1 μm or larger is 1000 pcs/ml or less, wherein, in the finish polishing step, the semiconductor wafer is polished using the polishing slurry adjusted in the second slurry adjusting step.

* * * * *